(12) United States Patent
Nozaki et al.

(10) Patent No.: US 10,495,971 B2
(45) Date of Patent: Dec. 3, 2019

(54) PHOTOSENSITIVE RESIN COMPOSITION, PLANOGRAPHIC PRINTING PLATE PRECURSOR, AND PLATE-MAKING METHOD FOR PLANOGRAPHIC PRINTING PLATE

(71) Applicant: FUJIFILM CORPORATION, Minato-ku, Tokyo (JP)

(72) Inventors: Atsuyasu Nozaki, Shizuoka (JP); Yuichi Yasuhara, Shizuoka (JP)

(73) Assignee: FUJIFILM CORPORATION, Tokyo (JP)

( * ) Notice: Subject to any disclaimer, the term of this patent is extended or adjusted under 35 U.S.C. 154(b) by 96 days.

(21) Appl. No.: 15/865,258

(22) Filed: Jan. 9, 2018

(65) Prior Publication Data
US 2018/0129136 A1 May 10, 2018

Related U.S. Application Data

(63) Continuation of application No. PCT/JP2016/073654, filed on Aug. 10, 2016.

(30) Foreign Application Priority Data

Aug. 31, 2015 (JP) .................. 2015-171038
Jun. 29, 2016 (JP) .................. 2016-129350

(51) Int. Cl.
| | | |
|---|---|---|
| G03F 7/32 | (2006.01) | |
| G03F 7/039 | (2006.01) | |
| G03F 7/12 | (2006.01) | |
| G03F 7/20 | (2006.01) | |

(52) U.S. Cl.
CPC ............... *G03F 7/039* (2013.01); *G03F 7/12* (2013.01); *G03F 7/32* (2013.01); *G03F 7/20* (2013.01)

(58) Field of Classification Search
CPC .................................................. B41C 1/1008
See application file for complete search history.

(56) References Cited

U.S. PATENT DOCUMENTS

| | | | |
|---|---|---|---|
| 8,901,225 B2 | 12/2014 | Okuda et al. | |
| 2005/0064325 A1* | 3/2005 | Nakamura | B41C 1/1008 430/270.1 |
| 2005/0214675 A1 | 9/2005 | Watanabe et al. | |
| 2007/0122743 A1 | 5/2007 | Maemoto | |

FOREIGN PATENT DOCUMENTS

| | | |
|---|---|---|
| JP | 2000-143806 A | 5/2000 |
| JP | 2003-315995 A | 11/2003 |
| JP | 2004-145320 A | 5/2004 |
| JP | 2004145320 A * | 5/2004 |
| JP | 2004-157461 A | 6/2004 |
| JP | 2005-091429 A | 4/2005 |
| JP | 2005-258070 A | 9/2005 |
| JP | 2005-266001 A | 9/2005 |
| JP | 2006-225432 A | 8/2006 |
| WO | 2011/067998 A1 | 6/2011 |

OTHER PUBLICATIONS

Extended European Search Report dated May 29, 2018, issued in corresponding EP Patent Application No. 16841455.5.
International Search Report issued in International Application No. PCT/JP2016/073654 dated Nov. 1, 2016.
Written Opinion of the ISA issued in International Application No. PCT/JP2016/073654 dated Nov. 1, 2016.

* cited by examiner

*Primary Examiner* — Chanceity N Robinson
(74) *Attorney, Agent, or Firm* — SOLARIS Intellectual Property Group, PLLC

(57) ABSTRACT

A photosensitive resin composition includes a polymer compound having a structure represented by Formula 1 as a component A; and an infrared absorbent as a component B. A planographic printing plate precursor includes a support; a polymer compound, which has a structure represented by Formula 1, as a component A on the support; and a recording layer, which contains an infrared absorbent, as a component B on the support. In Formula 1, $R^1$ represents an (x+2) valent aromatic hydrocarbon ring group, and x represents an integer of 1 to 4.

Formula 1

$$\left[ \begin{array}{c} O \\ \parallel \\ C \\ | \\ N - R^1 \\ | \\ H \end{array} (OH)_x \right]$$

6 Claims, No Drawings

PHOTOSENSITIVE RESIN COMPOSITION, PLANOGRAPHIC PRINTING PLATE PRECURSOR, AND PLATE-MAKING METHOD FOR PLANOGRAPHIC PRINTING PLATE

CROSS-REFERENCE TO RELATED APPLICATIONS

This application is a Continuation of International Application No. PCT/JP2016/073654 filed on Aug. 10, 2016, which claims priority to Japanese Patent Application No. 2015-171038 filed on Aug. 31, 2015 and Japanese Patent Application No. 2016-129350 filed on Jun. 29, 2016. The entire contents of these applications are incorporated herein by reference.

BACKGROUND OF THE INVENTION

1. Field of the Invention

The present invention relates to a photosensitive resin composition, a planographic printing plate precursor, and a plate-making method for a planographic printing plate.

2. Description of the Related Art

In the related art, various photosensitive compositions have been used as visible image forming materials and planographic printing plate materials. In particular, the development of lasers in the planographic printing field in recent years has been remarkable, and in particular, solid lasers and semiconductor lasers having an emission region from a near infrared region to an infrared region, with a high output and a small size, have become easily available. In the field of planographic printing, as an exposure light source at the time of producing a printing plate directly from digital data from a computer or the like, these lasers are extremely useful.

A positive type planographic printing plate precursor for an infrared laser has an alkali-soluble binder resin and an infrared absorbing dye (IR dye), which absorbs light and generates heat, as essential components. In the unexposed portion (image area), the IR dye and the like act as a development restrainer which substantially decreases the solubility of a binder resin in a developer due to an interaction with the binder resin, and in the exposed portion (non-image area), the interaction between the IR dye and the like and the binder resin weakens due to the generated heat, and the IR dye and the like are dissolved in an alkaline developer, and as the result, a planographic printing plate is formed.

A positive type planographic printing plate precursor for an infrared laser has an alkali-soluble binder resin and an infrared absorbing dye (IR dye), which absorbs light and generates heat, as essential components. In the unexposed portion (image area), the IR dye and the like act as a development restrainer which substantially decreases the solubility of a binder resin in a developer due to an interaction with the binder resin, and in the exposed portion (non-image area), the interaction between the IR dye and the like and the binder resin weakens due to the generated heat, and the IR dye and the like are dissolved in an alkaline developer, and as the result, a planographic printing plate is formed.

As planographic printing plate precursors in the related art, the planographic printing plate precursors described in JP2005-91429A, JP2005-258070A, JP2003-315995A, and JP2006-225432A are known.

SUMMARY OF THE INVENTION

However, in a case where a recording layer formed of a resin composition exhibiting characteristics in which the solubility in an alkali aqueous solution in the exposure region is further excellent is used in the planographic printing plate material obtained by applying such a photosensitive positive type resin composition, the strength of the image forming layer in the unexposed region is reduced, and both developability and printing durability are less likely to be achieved.

In addition, in recent years, there is an increasing demand for cost reduction in printing market, and inexpensive print materials are being widely used. Among the inexpensive print materials, there are a paper material and ink including coarse particles. In a case where printing is performed using these, the coarse particles damage the image areas, and due to this, the number of printed sheets is significantly reduced.

In order to solve the above-described problems, a planographic printing plate precursor provided with a recording layer having excellent alkali solubility, including a polyurethane resin, a polyamide resin, or a phenolic resin is disclosed (refer to JP2005-91429A, JP2005-258070A, JP2003-315995A, or JP2006-225432A). This planographic printing plate precursor has excellent chemical resistance, but there is room for improvement in any of the developability of the exposed portion or the printing durability.

An object of an embodiment of the present invention is to provide a photosensitive resin composition from which a planographic printing plate having excellent printing durability and chemical resistance can be obtained and which has excellent alkali aqueous solution developability; a planographic printing plate precursor from which a planographic printing plate having excellent printing durability and chemical resistance can be obtained and which has excellent alkali aqueous solution developability; and a plate-making method for a planographic printing plate using the planographic printing plate precursor.

The above-described object of the present invention has been achieved by the means according to the following <1>, <5>, or <11>. The following <1>, <5>, or <11> is described below together with <2> to <4> and <6> to <10> which are preferred embodiments.

<1> A photosensitive resin composition comprising: a polymer compound which has a structure represented by Formula 1 as a component A; and an infrared absorbent as a component B.

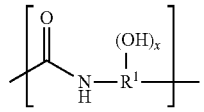

Formula 1

In Formula 1, $R^1$ represents an (x+2) valent aromatic hydrocarbon ring group, and x represents an integer of 1 to 4.

<2> The photosensitive resin composition according to <1>, in which the component A is a polymer compound having a structure represented by Formula 2.

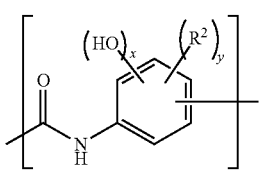

Formula 2

In Formula 2, $R^2$'s each independently represent an alkyl group or an aryl group, x represents an integer of 1 to 4, and y represents an integer of 0 to 3.

<3> The photosensitive resin composition according to <1> or <2>, in which the component A is a polymer compound having a structure represented by Formula 3.

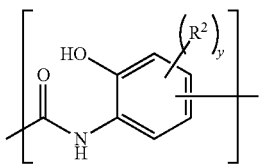

Formula 3

In Formula 3, $R^2$'s each independently represent an alkyl group or an aryl group, and y represents an integer of 0 to 3.

<4> The photosensitive resin composition according to any one of <1> to <3> which is a positive type photosensitive resin composition.

<5> A planographic printing plate precursor comprising: a support; a polymer compound, which has a structure represented by Formula 1, as a component A on the support; and a recording layer, which contains an infrared absorbent, as a component B on the support.

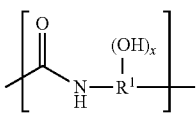

Formula 1

In Formula 1, $R^1$ represents an (x+2) valent aromatic hydrocarbon ring group, and x represents an integer of 1 to 4.

<6> The planographic printing plate precursor according to <5>, in which the component A is a polymer compound having a structure represented by Formula 2.

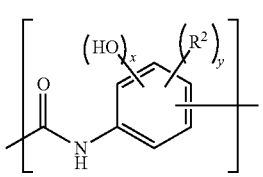

Formula 2

In Formula 2, $R^2$'s each independently represent an alkyl group or an aryl group, x represents an integer of 1 to 4, and y represents an integer of 0 to 3.

<7> The planographic printing plate precursor according to <5> or <6>, in which the component A is a polymer compound having a structure represented by Formula 3.

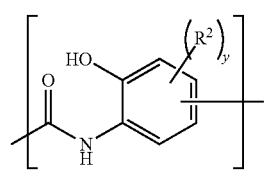

Formula 3

In Formula 3, $R^2$'s each independently represent an alkyl group or an aryl group, and y represents an integer of 0 to 3.

<8> The planographic printing plate precursor according to any one of <5> to <7> which is a positive type planographic printing plate precursor.

<9> The planographic printing plate precursor according to any one of <5> to <8>, in which the recording layer has a two-layer structure formed of a lower layer and an upper layer, and at least one layer of the lower layer or the upper layer contains the component A and the component B.

<10> The planographic printing plate precursor according to any one of <5> to <9>, further comprising: an interlayer between the support and the recording layer.

<11> A plate-making method for a planographic printing plate, comprising: an exposure step of image-exposing the planographic printing plate precursor according to any one of <5> to <10>; and a development step of developing the exposed planographic printing plate precursor using an alkali aqueous solution having a pH of 8.5 to 13.5.

According to an embodiment of the present invention, it is possible to provide a photosensitive resin composition from which a planographic printing plate having excellent printing durability and chemical resistance can be obtained and which has excellent alkali aqueous solution developability; a planographic printing plate precursor from which a planographic printing plate having excellent printing durability and chemical resistance can be obtained and which has excellent alkali aqueous solution developability; and a plate-making method for a planographic printing plate using the planographic printing plate precursor.

DESCRIPTION OF THE PREFERRED EMBODIMENTS

Hereinafter, the content of the present disclosure will be described in detail. The description of constituent elements below will be made based on representative embodiments of the present disclosure, but the present disclosure is not limited to such embodiments. Further, in the specification of the present application, the numerical ranges shown using "to" indicate ranges including the numerical values described before and after "to" as the lower limits and the upper limits.

In a case where groups (atomic groups) are noted without mentioning substitution and unsubstitution in the present specification, the concept thereof includes groups which do not have substituents and groups which have substituents. For example, the concept of an "alkyl group" includes not only an alkyl group (unsubstituted alkyl group) which does not have a substituent but also an alkyl group (substituted alkyl group) which has a substituent.

Further, the chemical structural formulae in the present specification may be simplified structural formulae by omitting hydrogen atoms.

Further, in the present specification, "(meth)acrylate" indicates acrylate and methacrylate; "(meth)acryl" indicates acryl and methacryl; and "(meth)acryloyl" indicates acryloyl and methacryloyl.

Further, in the present disclosure, "% by mass" has the same definition as that for "% by weight"; and "part by mass" has the same definition as that for "parts by weight".

Further, in the present disclosure, a combination of two or more preferred aspects is a more preferred aspect.

(Photosensitive Resin Composition)

A photosensitive resin composition of the present disclosure includes a polymer compound which has a structure represented by Formula 1 as a component A; and an infrared absorbent as a component B.

Further, it is preferable that the photosensitive resin composition of the present disclosure is a positive type photosensitive resin composition.

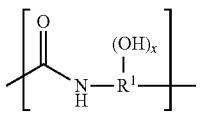

Formula 1

In Formula 1, $R^1$ represents an (x+2) valent aromatic hydrocarbon ring group, and x represents an integer of 1 to 4.

As a result of conducting extensive research conducted by the present inventors, it was found that, in a case where the photosensitive resin composition or the photosensitive layer of the planographic printing plate precursor described below contains a polymer compound having a structure represented by Formula 1 and an infrared absorbent, a planographic printing plate with excellent printing durability and chemical resistance can be obtained and a photosensitive resin composition or a planographic printing plate precursor with excellent alkali aqueous solution developability can be provided.

Although the action mechanism of the excellent effects due to containing the above materials is not clear, it is estimated as follows.

Based on the research conducted by the present inventors, it was found that the film hardness of a resin is important for the printing durability in printing and the film hardness is significantly affected by an interaction between polymer compounds. In particular, the effect is significant in low-quality print materials, and sufficient film hardness is less likely to be imparted in a case of typical acrylic resins or polyurethane resins. It is considered that this is because inorganic salt particles (calcium carbonate, kaolin, or the like) contained in a print material (paper, ink, or the like) are eluted during printing, this polishes the image area of the printing plate, and thus abrasion is promoted. In contrast, it is considered that the interaction between polymer compounds is high, the resistance to chemicals (cleaners, organic compounds, and the like) used in the printing is extremely high, the strength of the image area is excellent, and printing durability is excellent because the polymer compound in the present disclosure has an amide structure having a high interaction between polymer compounds. It is estimated that this is caused by improvement of the film hardness of the resin and effects of suppressing abrasion of the image area of the printing plate. Further, it is estimated that the alkali solubility of the polymer compound is increased, the permeation speed of a developer is increased, and the alkali aqueous solution developability of the exposed portion becomes excellent in a case where the polymer compound of the present disclosure includes a phenolic hydroxyl group. Further, since the polymer compound of the present disclosure has a plurality of amide bonds with an extremely high interaction and excellent aggregating properties, the printing durability becomes excellent. It is estimated that this is caused by improvement of the film hardness of the resin and effects of suppressing abrasion of the image area of the printing plate.

It is considered that both of the strength (printing durability) of the image area and the chemical resistance can be achieved as the result of the above-described mechanism.

Hereinafter, first, the polymer compound having a structure represented by Formula 1 and the infrared absorbent, which are essential components of the photosensitive resin composition of the present disclosure will be described.

<Polymer Compound Having Structure Represented by Formula 1>

The photosensitive resin composition of the present disclosure contains a polymer compound (hereinafter, also referred to as a "specific polymer compound") having a structure represented by Formula 1 as a component A.

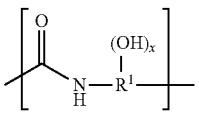

Formula 1

In Formula 1, $R^1$ represents an (x+2) valent aromatic hydrocarbon ring group, and x represents an integer of 1 to 4.

It is preferable that x number of hydroxy groups in Formula 1 are groups directly bonded to an aromatic hydrocarbon ring, that are, phenolic hydroxy groups.

In Formula 1, x represents preferably 1 or 2 and more preferably 1. With the above-described aspect, a planographic printing plate with excellent printing durability and chemical resistance can be obtained and the alkali aqueous solution developability becomes excellent.

It is preferable that the (x+2) valent aromatic hydrocarbon ring group as $R^1$ in Formula 1 is a group formed by removing (x+2) hydrogen atoms from the aromatic hydrocarbon ring.

The aromatic hydrocarbon ring is not particularly limited, but a benzene ring or a naphthalene ring is preferable; and a benzene ring is more preferable.

Further, the aromatic hydrocarbon ring may include a substituent on the aromatic ring.

Examples of the substituent include an alkyl group, an aryl group, a halogen atom, an alkoxy group, an alkoxycarbonyl group, and an acyl group. In addition, the substituent may be further substituted with another substituent or two or more substituents are bonded to one another to form a ring. Further, the number of carbon atoms in the substituent is preferably in a range of 0 to 20, more preferably in a range of 0 to 12, and still more preferably in a range of 0 to 8.

The component A may have only one or two or more structures represented by Formula 1.

Further, it is preferable that the component A is a polymer compound having a structure represented by Formula 2. With the above-described aspect, a planographic printing plate with excellent printing durability and chemical resistance can be obtained and the alkali aqueous solution developability becomes excellent.

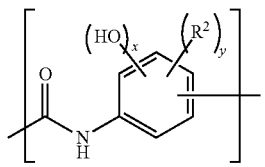

Formula 2

In Formula 2, $R^2$'s each independently represent an alkyl group or an aryl group, x represents an integer of 1 to 4, and y represents an integer of 0 to 3.

In Formula 2, x represents preferably 1 or 2 and more preferably 1. With the above-described aspect, a planographic printing plate with excellent printing durability and chemical resistance can be obtained and the alkali aqueous solution developability becomes excellent.

In Formula 2, y represents preferably 0 or 1 and more preferably 0.

It is preferable that $R^2$ in Formula 2 represents an alkyl group having 1 to 8 carbon atoms or an aryl group having 6 to 12 carbon atoms.

Further, the bonding position, on the benzene ring of Formula 2, with another structure other than the structure in formula 2 is not particularly limited, and the position may be an o-position, an m-position, or a p-position of an amide group, but an m-position or a p-position is preferable and a p-position is more preferable.

Further, it is more preferable that the component A is a polymer compound having a structure represented by Formula 3. With the above-described aspect, the amide group and the hydroxy group in Formula 3 can be subjected to dehydration condensation and cyclized to form a benzoxazole ring. Since the cyclization occurs due to heat from post-baking or the like after development so that a benzoxazole ring is formed, a planographic printing plate with excellent printing durability and further excellent printing durability and chemical resistance particularly after a heat treatment (burning) can be obtained.

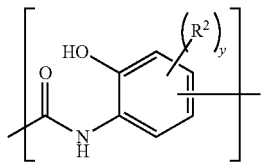

Formula 3

In Formula 3, $R^2$'s each independently represent an alkyl group or an aryl group, and y represents an integer of 0 to 3.

In Formula 3, y represents preferably 0 or 1 and more preferably 0.

It is preferable that $R^2$ in Formula 3 represents an alkyl group having 1 to 8 carbon atoms or an aryl group having 6 to 12 carbon atoms.

Further, the bonding position, on the benzene ring of Formula 3, with another structure other than the structure in formula 3 is not particularly limited, but it is preferable that the position is a p-position of an amide group or a p-position of a hydroxy group.

Further, the component A is preferably a polyamide resin, more preferably a linear polyamide resin, and still more preferably a resin obtained by polycondensing a bifunctional amino compound and a bifunctional carboxy compound or an equivalent thereof.

Preferred examples of the equivalent of the carboxy compound include a carboxylic acid halide compound and a carboxylic acid ester compound.

Among these, from the viewpoints of the reaction activity and the reaction rate, it is particularly preferable that the component A is a resin obtained by polycondensing a bifunctional amino compound and a bifunctional carboxylic acid halide compound.

In the present disclosure, the "main chain" indicates the relatively longest bonding chain in a molecule of a polymer compound constituting a resin and the "side chain" indicates a carbon chain branched from the main chain.

Further, it is preferable that the component A is a resin having an alkyleneoxy group in the main chain. According to the above-described aspect, it is possible to obtain a photosensitive resin composition from which a planographic printing plate having excellent image formability and printing durability is obtained.

As the alkyleneoxy group, an alkyleneoxy group having 2 to 10 carbon atoms is preferable; an alkyleneoxy group having 2 to 8 carbon atoms is more preferable; an alkyleneoxy group having 2 to 4 carbon atoms is still more preferable; and an ethyleneoxy group, a propyleneoxy group, or an isopropyleneoxy group is particularly preferable.

Further, the alkyleneoxy group may be a polyalkyleneoxy group.

As the polyalkyleneoxy group, a polyalkyleneoxy group having a repetition number of 2 to 50 is preferable; a polyalkyleneoxy group having a repetition number of 2 to 40 is more preferable; and a polyalkylene group having a repetition number of 2 to 30 is still more preferable.

The preferable number of carbon atoms in a constituting repeating unit of the polyalkyleneoxy group is the same as the preferable number of carbon atoms in the alkyleneoxy group.

As a structure to which a phenolic hydroxy group is bonded, it is preferable that the component A has a benzene structure, a diphenylmethane structure, a diphenylsulfone structure, a benzophenone structure, a biphenyl structure, a naphthalene structure, an anthracene structure, or a terphenyl structure; more preferable that the component A has a diphenylmethane structure, a diphenylsulfone structure, a benzophenone structure, or a biphenyl structure; and still more preferable that the component A has a diphenylmethane structure or a biphenyl structure.

Further, as the component A, a resin having a constituting repeating unit represented by Formula 4 is preferable; a polyamide resin having a constituting repeating unit represented by Formula 4 is more preferable; a polyamide resin having 90% by mass or greater of a constituting repeating unit represented by Formula 4 is still more preferable; and a polyamide resin formed of a constituting repeating unit represented by Formula 4 is particularly preferable. Further, in a case where the component A is a polyamide resin formed of a constituting repeating unit represented by Formula 4, the terminal structure depends on a quenching agent used in a case where the polycondensation is stopped, and examples thereof include a group selected from the group consisting of a hydrogen atom, a hydroxy group, and an alkoxy group.

Further, the component A may have only one or two or more constituting repeating units represented by Formula 4.

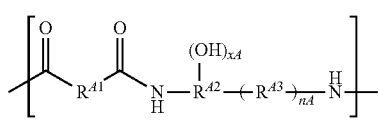

Formula 4

In Formula 4, $R^{41}$ represents a divalent linking group, $R^{42}$ represents an (xA+2) valent aromatic hydrocarbon ring group, $R^{43}$ represents a divalent linking group, xA represents an integer of 1 to 4, and nA represents 0 or 1.

Further, $R^{42}$ in Formula 4 and xA number of hydroxy groups and amide bonds bonded to $R^{42}$ correspond to the structure represented by Formula 1.

$R^{42}$ and xA in Formula 4 respectively have the same definitions as those for $R^1$ and x in Formula 1 and the preferable aspects thereof are respectively the same as described above.

As $R^{41}$ in Formula 4, an alkylene group, a cycloalkylene group, an arylene group, or a group formed by bonding two or more of these groups to one another is preferable; an alkylene group, a cycloalkylene group, an arylene group, or a biphenyl group is more preferable; an alkylene group or a phenylene group is still more preferable; and an m-phenylene group or a p-phenylene group is particularly preferable.

The alkylene group, the cycloalkylene group, the arylene group, and the group formed by bonding two or more of these groups to one another described above may include a substituent, but it is preferable that these groups do not include a substituent.

Examples of the substituent include an alkyl group, an aryl group, a halogen atom, an alkoxy group, an alkoxycarbonyl group, and an acyl group. In addition, the substituent may be further substituted with another substituent or two or more substituents are bonded to one another to form a ring. Further, the number of carbon atoms in the substituent is preferably in a range of 0 to 20, more preferably in a range of 0 to 12, and still more preferably in a range of 0 to 8.

The number of carbon atoms in the group as $R^{41}$ is preferably in a range of 1 to 30 and more preferably in a range of 3 to 20

It is preferable that nA in Formula 4 represents 1.

As $R^{43}$ in Formula 4, an alkylene group, a cycloalkylene group, an aromatic hydrocarbon ring group, or a group formed by bonding a group selected from the group consisting of an alkylene group, a cycloalkylene group, an aromatic hydrocarbon ring group, a carbonyl group, a sulfonyl group, and a fluorenyl group to an aromatic hydrocarbon ring group is preferable; and an aromatic hydrocarbon ring group or a group formed by bonding a group selected from the group consisting of a methylene group, a 2,2-propanediyl group, a bistrifluoromethylmethylene group, a sulfonyl group, and a fluorenyl group to an aromatic hydrocarbon ring group is more preferable.

The alkylene group, the cycloalkylene group, the aromatic hydrocarbon ring group, or the group formed by bonding a group selected from the group consisting of an alkylene group, a cycloalkylene group, an aromatic hydrocarbon ring group, a carbonyl group, a sulfonyl group, and a fluorenyl group to an aromatic hydrocarbon ring group may include a substituent, but it is preferable that these groups do not include a substituent.

Examples of the substituent include an alkyl group, an aryl group, a halogen atom, an alkoxy group, an alkoxycarbonyl group, and an acyl group. In addition, the substituent may be further substituted with another substituent or two or more substituents are bonded to one another to form a ring. Further, the number of carbon atoms in the substituent is preferably in a range of 0 to 20, more preferably in a range of 0 to 12, and still more preferably in a range of 0 to 8.

As the aromatic hydrocarbon ring group as $R^{43}$, an aromatic hydrocarbon ring group having a hydroxy group is preferable; an aromatic hydrocarbon ring group having 1 to 4 hydroxy groups is more preferable; and an aromatic hydrocarbon ring group having one hydroxy group is particularly preferable.

Further, it is preferable that the constituting repeating unit represented by Formula 4 is a constituting repeating unit represented by any one of Formulae 4-1 to 4-6.

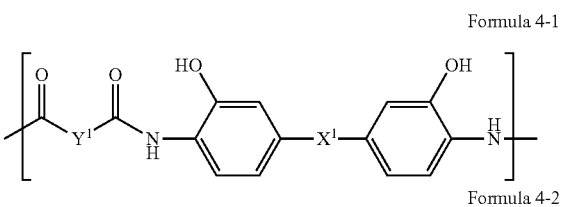

Formula 4-1

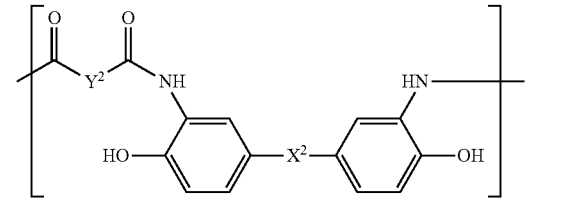

Formula 4-2

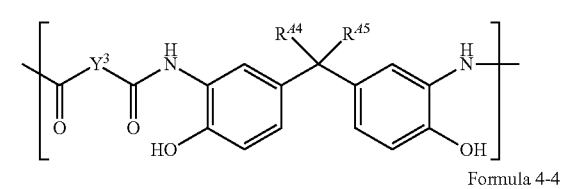

Formula 4-3

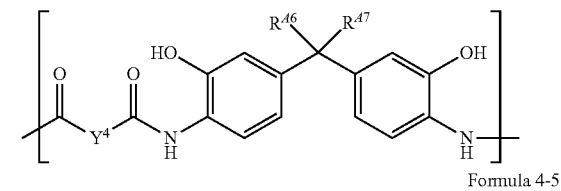

Formula 4-4

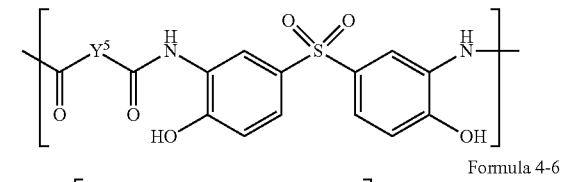

Formula 4-5

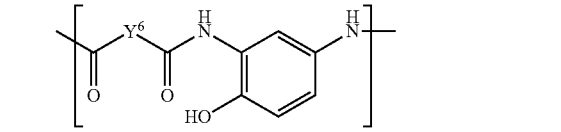

Formula 4-6

In Formulae 4-1 to 4-6, $Y^1$ to $Y^6$ each independently represent a divalent linking group, $X^1$ and $X^2$ each independently represent a single bond, an alkylene group, or a carbonyl group, and $R^{44}$ to $R^{47}$ each independently represent a hydrogen atom or an alkyl group.

$Y^1$ to $Y^6$ in Formulae 4-1 to 4-6 have the same definitions as those for $R^{41}$ in Formula 4 and the preferable aspects thereof are the same as described above.

$X^1$ and $X^2$ in Formulae 4-1 to 4-6 each independently represent preferably a single bond, a methylene group, or a carbonyl group and more preferably a single bond.

The alkyl group as $R^{44}$ to $R^{47}$ may include a substituent.

Examples of the substituent include a halogen atom, an alkyl group, and an aryl group. Among these, a halogen atom is preferable and a fluorine atom is more preferable.

$R^{44}$ to $R^{47}$ in Formulae 4-1 to 4-6 each independently represent preferably a hydrogen atom, a methyl group, or a trifluoromethyl group and more preferably a methyl group or a trifluoromethyl group.

Further, it is preferable that $R^{44}$ and $R^{45}$ represent the same group and $R^{46}$ and $R^{47}$ represent the same group.

The content of the constituting repeating unit, represented by any of Formulae 4-1 to 4-6, in the component A is preferably in a range of 10% to 100% by mass, more preferably in a range of 10% to 100% by mass, still more preferably in a range of 30% to 100% by mass, and particularly preferably in a range of 50% to 100% by mass.

A weight-average molecular weight Mw of the component A is preferably in a range of 10000 to 500000, more preferably in a range of 10000 to 200000, and still more preferably in a range of 20000 to 100000.

The weight-average molecular weight in the present disclosure can be calculated according to a standard polystyrene conversion method using gel permeation chromatography (GPC). A column filled with a polystyrene cross-linked gel (TSKgel SuperAWM-H; manufactured by Tosoh Corporation) can be used as the GPC column, and N-methylpyrrolidone (0.01 mol/L of each of phosphoric acid and lithium bromide) can be used as the GPC solvent.

Hereinafter, the component A will be described with reference to specific examples.

It is preferable that the component A is a polymer in which a dianiline compound containing a phenolic hydroxyl group at the ortho-position, a compound containing two or more carboxylic acid halide groups, or a compound containing two or more carboxy groups are generated through a sequential polymerization reaction.

Preferred specific examples of the component A are listed in Table 1. PA-1 to PA-35 in the specific examples indicate polymer compounds formed by reacting a dianiline compound containing a phenolic hydroxyl group at the ortho-position, a compound having two or more carboxylic acid halide groups or a compound having two or more carboxy groups, and optionally other diamine compounds, listed in Table 1, at proportions (molar ratios) listed in Table 1.

Further, the weight-average molecular weights (Mw) of PA-1 to PA-35 are listed in Table 1, but the component A used in the present disclosure is not limited to these. Further, the weight-average molecular weight of the polymer is a value measured according to a GPC method.

TABLE 1

| Component A | Dianiline compound-1 containing phenolic hydroxyl group at ortho-position (containing molar ratio) | Dianiline compound-2 containing phenolic hydroxyl group at ortho-position (containing molar ratio) | Diamine compound (containing molar ratio) | Carboxylic acid halide compound-1 (containing molar ratio) | Carboxylic acid halide compound-2 (containing molar ratio) | Weight-average molecular weight (ten thousand) |
|---|---|---|---|---|---|---|
| PA-1 | SA-1 50 | — | — | CL-9 50 | — | 4.5 |
| PA-2 | SA-1 45 | — | DA-1 5 | CL-9 50 | — | 4.1 |
| PA-3 | SA-1 42.5 | — | DA-1 7.5 | CL-9 50 | — | 4.3 |
| PA-4 | SA-1 40 | — | DA-32 10 | CL-9 50 | — | 4.3 |
| PA-5 | SA-1 50 | — | — | CL-9 30 | CL-5 20 | 4.5 |
| PA-6 | SA-1 50 | — | — | CL-9 35 | CL-5 15 | 4.5 |
| PA-7 | SA-1 50 | — | — | CL-9 40 | CL-5 10 | 4.8 |
| PA-8 | SA-1 45 | — | DA-36 5 | CL-9 50 | — | 5.1 |
| PA-9 | SA-1 40 | — | DA-36 10 | CL-9 50 | — | 4.8 |
| PA-10 | SA-1 30 | SA-2 20 | — | CL-2 50 | — | 4.8 |
| PA-11 | SA-1 35 | SA-2 15 | — | CL-2 50 | — | 3.8 |
| PA-12 | SA-1 30 | SA-2 20 | — | CL-5 50 | — | 3.5 |
| PA-13 | SA-1 32.5 | SA-2 17.5 | — | CL-5 50 | — | 5.2 |
| PA-14 | SA-1 35 | SA-2 15 | — | CL-5 50 | — | 5.1 |
| PA-15 | SA-1 35 | SA-2 15 | — | CL-2 25 | CL-5 25 | 5.2 |
| PA-16 | SA-1 35 | SA-2 15 | — | CL-8 50 | — | 5.2 |
| PA-17 | SA-1 50 | — | — | CL-9 40 | CL-10 10 | 5.4 |
| PA-18 | SA-1 50 | — | — | CL-9 35 | CL-10 15 | 4.5 |

TABLE 1-continued

| Component A | Dianiline compound-1 containing phenolic hydroxyl group at ortho-position (containing molar ratio) | Dianiline compound-2 containing phenolic hydroxyl group at ortho-position (containing molar ratio) | Diamine compound (containing molar ratio) | Carboxylic acid halide compound-1 (containing molar ratio) | Carboxylic acid halide compound-2 (containing molar ratio) | Weight-average molecular weight (ten thousand) |
|---|---|---|---|---|---|---|
| PA-19 | SA-1 30 | SA-3 20 | — | CL-5 50 | — | 4.8 |
| PA-20 | SA-1 40 | SA-3 10 | — | CL-2 50 | — | 4.9 |
| PA-21 | SA-1 35 | SA-3 15 | — | CL-9 50 | — | 4.7 |
| PA-22 | SA-1 35 | SA-3 15 | — | CL-9 50 | — | 4.7 |
| PA-23 | SA-1 30 | SA-3 20 | — | CL-8 50 | — | 4.8 |
| PA-24 | SA-1 25 | SA-3 25 | — | CL-8 50 | — | 4.9 |
| PA-25 | SA-2 50 | — | — | CL-8 50 | — | 4.8 |
| PA-26 | SA-2 50 | — | — | CL-8 30 | CL-10 20 | 5.8 |
| PA-27 | SA-2 50 | — | — | CL-8 25 | CL-10 25 | 5.1 |
| PA-28 | SA-1 40 | — | DA-30 10 | CL-2 50 | — | 4.8 |
| PA-29 | SA-1 40 | — | DA-30 10 | CL-9 50 | — | 4.2 |
| PA-30 | SA-1 50 | — | — | CL-3 50 | — | 4.5 |
| PA-31 | SA-9 50 | — | — | CL-9 50 | — | 4.5 |
| PA-32 | SA-9 50 | — | — | CL-2 50 | — | 4.8 |
| PA-33 | SA-9 50 | — | — | CL-9 30 | CL-2 20 | 4.2 |
| PA-34 | SA-9 45 | — | DA-32 5 | CL-9 50 | — | 4.3 |
| PA-35 | SA-9 45 | — | DA-36 5 | CL-9 50 | — | 4.6 |

The specific structures of preferable compounds used for synthesis of the component A used in the present disclosure, which contains the compounds listed in Table 1, are as follows.

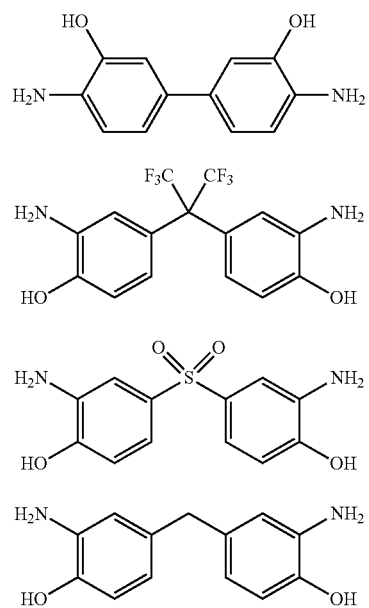

SA-1

SA-2

SA-3

SA-4

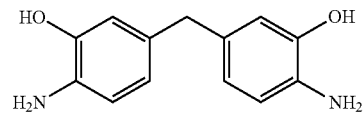

SA-5

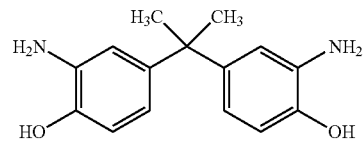

SA-6

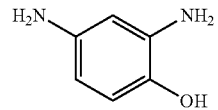

SA-7

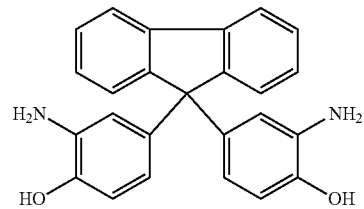

SA-8

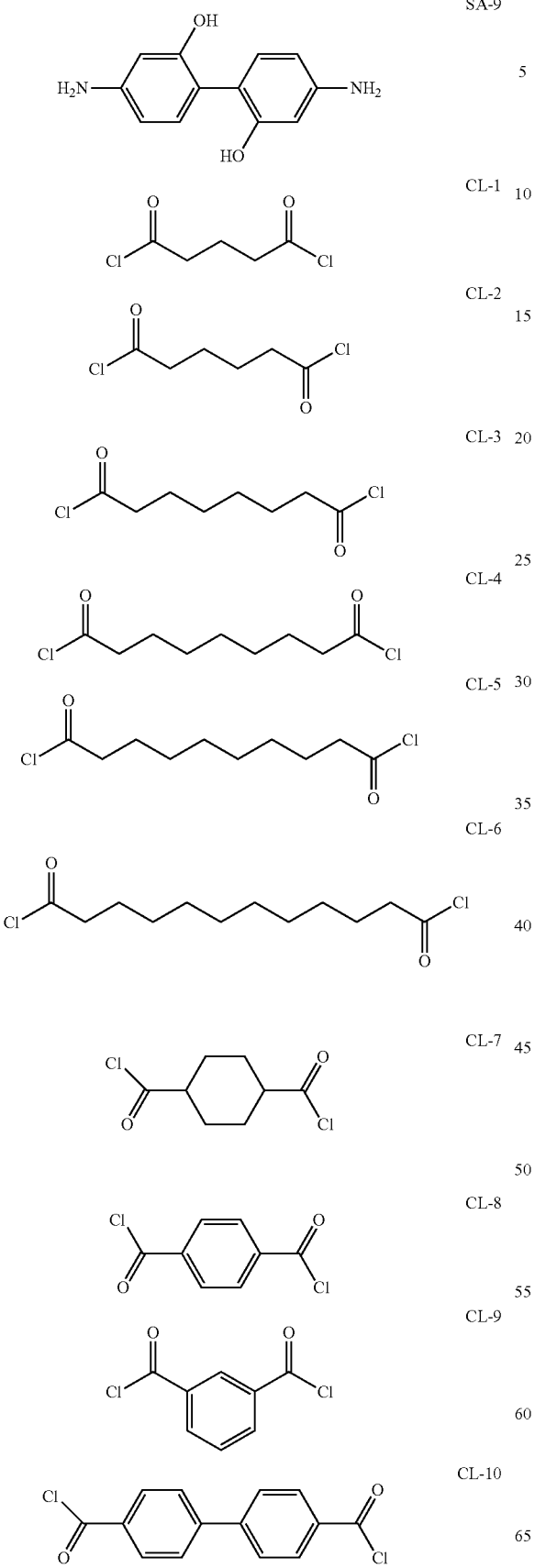
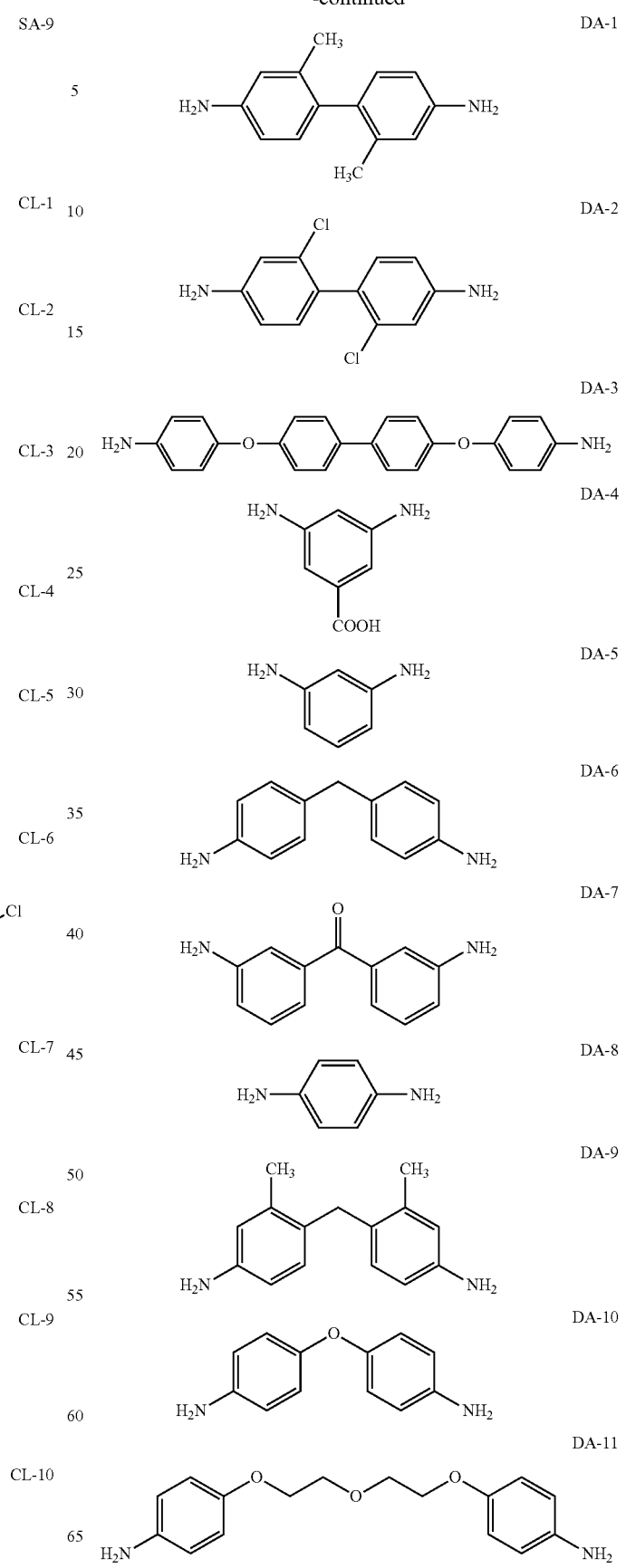

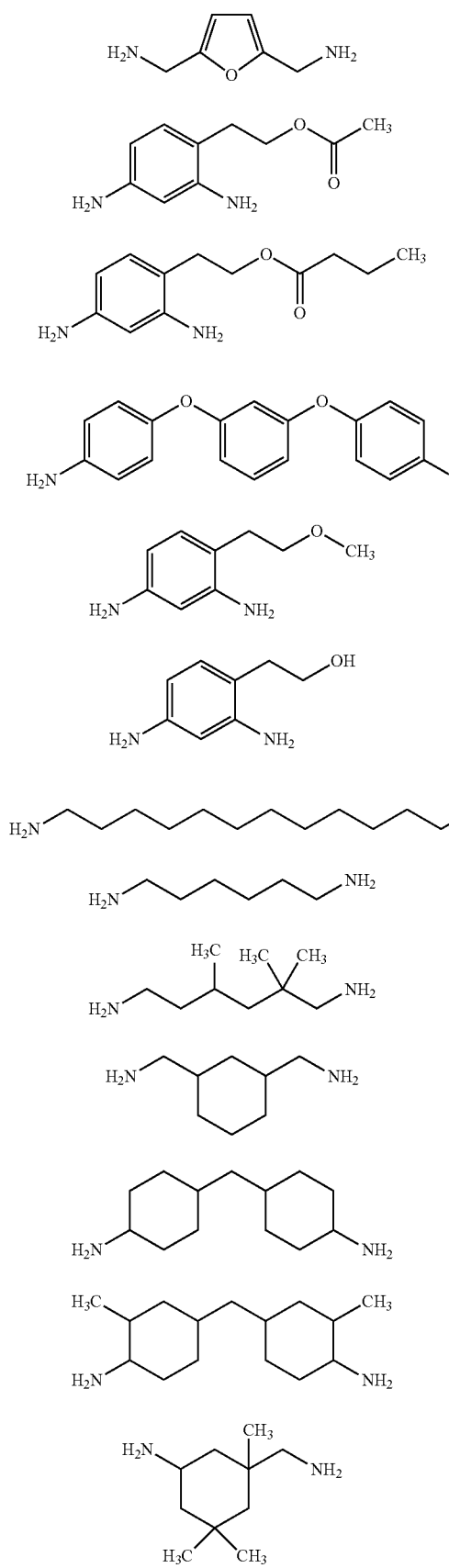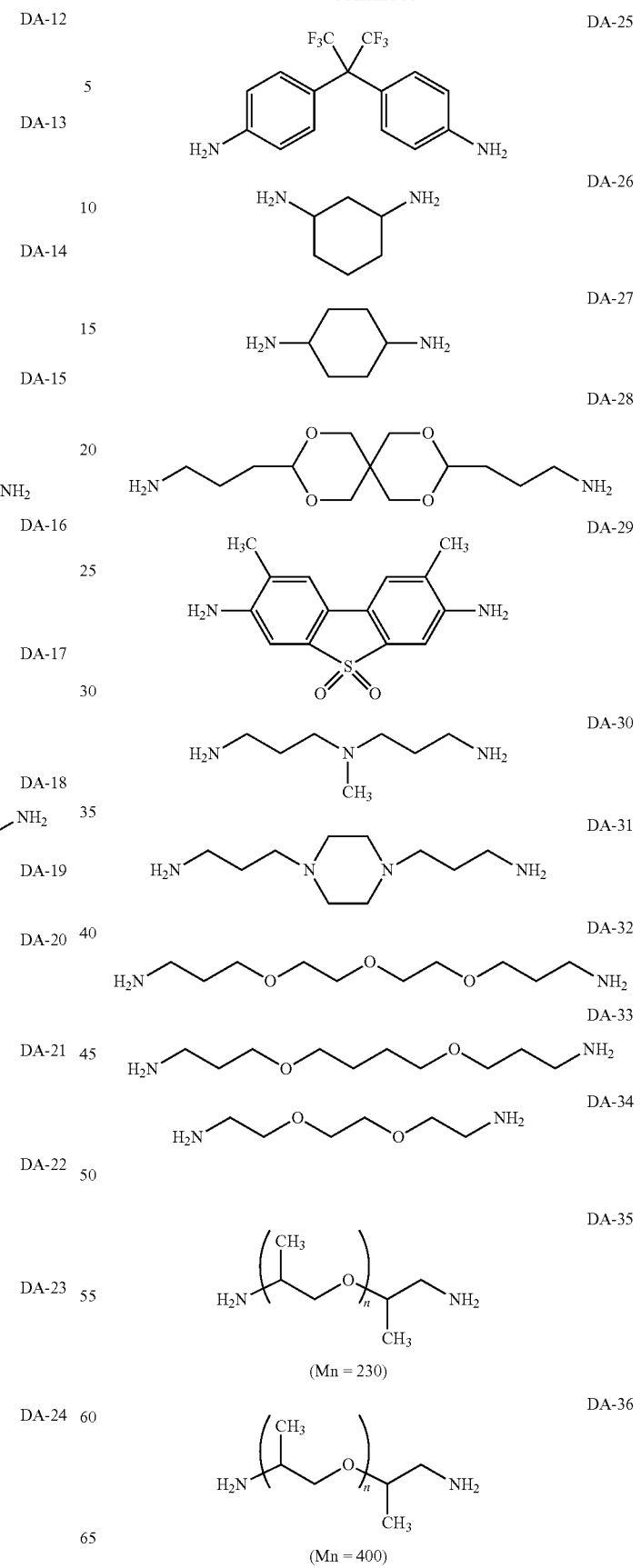

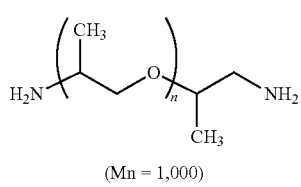

DA-37

(Mn = 1,000)

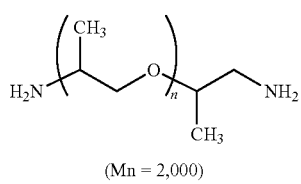

DA-38

(Mn = 2,000)

Among the examples described above, PA-1, PA-2, PA-3, PA-7, PA-9, PA-11, PA-13, or PA-17 is preferable as the component A.

The content of the component A is preferably in a range of 10% to 90% by mass, more preferably in a range of 20% to 80% by mass, and still more preferably in a range of 30% to 80% by mass with respect to the total mass of the solid content in the photosensitive resin composition of the present disclosure. In a case where the content of the specific polymer compound is in the above-described range, a photosensitive resin composition with excellent coating properties can be obtained.

Further, the solid content indicates the amount of components from which volatile components such as a solvent and the like have been removed.

<Infrared Absorbent>

The photosensitive resin composition of the present disclosure contains an infrared absorbent as a component B.

The infrared absorbent is not particularly limited as long as the infrared absorbent is a dye which generates heat by absorbing infrared light, and various dyes known as infrared absorbents can be used.

As the infrared absorbent which can be used in the present disclosure, commercially available dyes or known dyes described in documents (for example, "Dye Handbook", compiled by The Society of Synthetic Organic Chemistry, Japan, published in 1970) can be used. Specific examples thereof include dyes such as azo dyes, metal complex azo dyes, pyrazolone azo dyes, anthraquinone dyes, phthalocyanine dyes, carbonium dyes, quinone imine dyes, methine dyes, and cyanine dyes. In the present disclosure, among these dyes, a dye absorbing at least infrared light or near infrared light is preferable from the viewpoint of being suitable for utilization using a laser emitting infrared light or near infrared light, and a cyanine dye is particularly preferable.

Examples of such a dye absorbing at least infrared light or near infrared light include the cyanine dyes described in JP1983-125246A (JP-S58-125246A), JP1984-84356A (JP-S59-84356A), JP-1984-202829A (JP-S59-202829A), or JP1985-78787A (JP-S60-78787A), the methine dyes described in JP1983-173696A (JP-S58-173696A), JP1983-181690A (JP-S58-181690A), or JP1983-194595A (JP-S58-194595A), the naphthoquinone dyes described in JP1983-112793A (JP-S58-112793A), JP1983-224793A (JP-S58-224793A), JP1984-48187A (JP-S59-48187A), JP1984-73996A (JP-S59-73996A), JP1985-52940A (JP-S60-52940A), or JP1985-63744A (JP-S60-63744A), the squarylium coloring agents described in JP1983-112792A (JP-S58-112792A), and the cyanine dyes described in GB434875B.

In addition, as the dye, the near infrared absorbing sensitizers described in U.S. Pat. No. 5,156,938A are also suitably used, also, the substituted aryl benzo(thio)pyrylium salts described in U.S. Pat. No. 3,881,924A, the trimethine thiapyrylium salts described in JP1982-142645A (JP-S57-142645A) (U.S. Pat. No. 4,327,169A), the pyrylium-based compounds described in JP1983-181051A (JP-S58-181051A), JP1983-220143A (JP-S58-220143A), JP1984-41363A (JP-S59-41363A), JP1984-84248A (JP-S59-84248A), JP1984-84249A (JP-S59-84249A), JP1984-146063A (JP-S59-146063A), or JP1984-146061A (JP-S59-146061A), the cyanine coloring agents described in JP1984-216146A (JP-S59-216146A), the pentamethinethiopyrylium salts described in U.S. Pat. No. 4,283,475A, or the pyrylium compounds described in JP1993-13514B (JP-H05-13514B) or JP1993-19702B (JP-H05-19702B) are used, and as commercially available products, Epolight III-178, Epolight III-130, Epolight III-125 manufactured by Epolin Inc., or the like is particularly preferably used.

In addition, particularly preferred other examples of the dye include near infrared absorbing dyes described as Formula (I) or (II) in U.S. Pat. No. 4,756,993A.

Among these dyes, a cyanine coloring agent, a phthalocyanine dye, an oxonol dye, a squarylium coloring agent, a pyrylium salt, a thiopyrylium dye, and a nickel thiolate complex are particularly preferable. Furthermore, in a case where a cyanine coloring agent represented by Formula (a) is used in the upper layer in the present disclosure, the dissolution suppressing action due to exposure is excellently released and the stability and the economic efficiency are excellent, and thus the cyanine coloring agent is most preferable.

Formula (a)

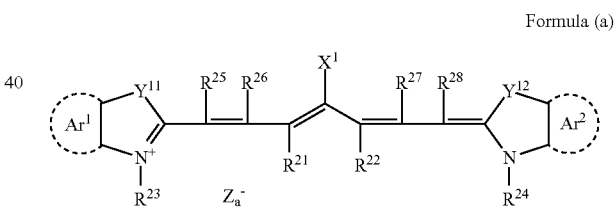

In Formula (a), $X^1$ represents a hydrogen atom, a halogen atom, a diarylamino group, $X^2$-$L^1$, or a group shown below. $X^2$ represents an oxygen atom or a sulfur atom. $L^1$ represents a hydrocarbon group having 1 to 12 carbon atoms, an aromatic ring group having a heteroatom, or a hydrocarbon group having 1 to 12 carbon atoms including a heteroatom. Here, the heteroatom represents N, S, O, a halogen atom, or Se.

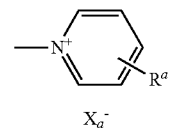

In the formula, $X_a^-$ has the same definition as that for $Z_a^-$ described below, and $R^a$ represents a substituent selected from the group consisting of a hydrogen atom, an alkyl group, an aryl group, a substituted or unsubstituted amino group, and a halogen atom.

$R^{11}$ and $R^{12}$ each independently represent a hydrocarbon group having 1 to 12 carbon atoms. From the viewpoint of storage stability of the photosensitive resin composition, it is preferable that $R^{21}$ and $R^{22}$ represent a hydrocarbon group having two or more carbon atoms and particularly preferable that $R^{21}$ and $R^{22}$ are bonded to each other to form a 5-membered ring or a 6-membered ring.

$Ar^1$ and $Ar^2$ may be the same as or different from each other and each represent an aromatic hydrocarbon group which may have a substituent. Preferred examples of the aromatic hydrocarbon group include a benzene ring and a naphthalene ring. In addition, preferred examples of the substituent include a hydrocarbon group having 1 to 12 carbon atoms, a halogen atom, and an alkoxy group having 1 to 12 carbon atoms.

$Y^{11}$ and $Y^{12}$ may be the same as or different from each other and each represent a sulfur atom or a dialkyl methylene group having 3 to 12 carbon atoms. $R^{23}$ and $R^{24}$ may be the same as or different from each other and each represent a hydrocarbon group having 1 to 20 carbon atoms which may have a substituent. Preferred examples of the substituent include an alkoxy group having 1 to 12 carbon atoms, a carboxyl group, and a sulfo group.

$R^{25}$, $R^{26}$, $R^{27}$, and $R^{28}$ may be the same as or different from each other and each represent a hydrogen atom or a hydrocarbon group having 1 to 12 carbon atoms. From the viewpoint of availability of a raw material, it is preferable that $R^{25}$, $R^{26}$, $R^{27}$, and $R^{28}$ each represent a hydrogen atom. In addition, $Za^-$ represents a counter anion. Here, in a case where the cyanine coloring agent represented by Formula (a) has an anionic substituent in the structure thereof so that neutralization of the charge is not necessary, $Za^-$ is not necessary. From the viewpoint of the storage stability of the photosensitive resin composition, as $Za^-$, a halide ion, a perchlorate ion, a tetrafluoroborate ion, a hexafluorophosphate ion, or a sulfonate ion is preferable; and a perchlorate ion, a hexafluorophosphate ion, or an arylsulfonate ion is particularly preferable.

Specific examples of the cyanine coloring agent represented by Formula (a) which can be suitably used include the cyanine coloring agents described in paragraphs 0017 to 0019 of JP2001-133969A, paragraphs 0012 to 0038 of JP2002-40638A, and paragraphs 0012 to 0023 of JP2002-23360A.

As the infrared absorbent contained in the upper layer, a cyanine dye A shown below is particularly preferable.

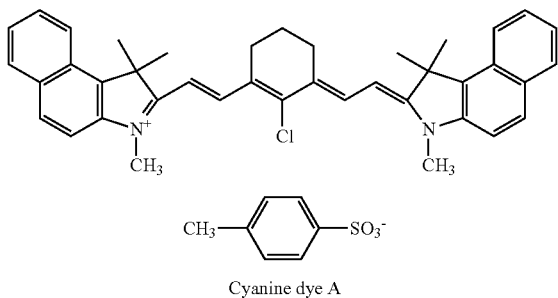

Cyanine dye A

The amount of the infrared absorbent to be added to the photosensitive resin composition of the present disclosure is preferably 0.01% by mass to 50% by mass, more preferably 0.1% by mass to 30% by mass, and particularly preferably 1.0% by mass to 30% by mass, with respect to the total solid content in the photosensitive resin composition. In a case where the amount of the infrared absorbent to be added is 0.01% by mass or greater, the layer becomes highly sensitive. Further, in a case where the amount thereof is 50% by mass or less, the uniformity of the layer is excellent and the durability of the layer is excellent.

<Other Alkali-Soluble Resin>

The photosensitive resin composition of the present disclosure may contain alkali-soluble resins (other alkali-soluble resins) other than the component A.

In the present disclosure, the "alkali-soluble" means that 0.01 g of a resin is dissolved in 5 g of a sodium hydroxide aqueous solution having a pH of 13.0 under a temperature condition of 30° C. within 200 seconds.

The alkali-soluble resin other than the component A used for the photosensitive resin composition of the present disclosure is not particularly limited as long as the resin has a characteristic in which the resin is dissolved at the time of being brought into contact with an alkaline developer, but a resin having an acidic functional group such as a phenolic hydroxy group, a sulfonic acid group, a phosphoric acid group, a sulfonamide group, or an active imide group in any one or both of the main chain and a side chain in the polymer is preferable. Examples of such a resin include a resin containing 10% by mole or greater of a monomer having an acidic functional group imparting alkali-solubility is exemplified, and a resin containing 20% by mole or greater is more preferable. In a case where the copolymerization component of the monomer imparting alkali-solubility is 10% by mole or greater, the alkali-solubility is sufficiently obtained and developability is excellent.

In addition, as other alkali-soluble resins, a novolac resin is also preferably exemplified.

As the novolac resin which can be used in the present disclosure, novolac resins such as a phenol formaldehyde resin, an m-cresol formaldehyde resin, a p-cresol formaldehyde resin, an m-/p-mixed cresol formaldehyde resin, a phenol/cresol (which may be any one of m-, p-, and a mixture of m-/p-) mixed formaldehyde resin or pyrogallol acetone resins are preferably exemplified.

In addition, a polycondensate of phenol having an alkyl group having 3 to 8 carbon atoms as a substituent and formaldehyde, such as a t-butylphenol formaldehyde resin or an octylphenol formaldehyde resin, as described in U.S. Pat. No. 4,123,279A, is exemplified. In addition, the weight-average molecular weight (Mw) thereof is preferably 500 or greater, and more preferably 1,000 to 700,000. In addition, the number average molecular weight (Mn) thereof is preferably 500 or greater, and more preferably 750 to 650,000. The dispersity (weight-average molecular weight/number average molecular weight) is preferably 1.1 to 10.

Other alkali-soluble resins preferably have a weight-average molecular weight of 2,000 or greater and a number average molecular weight of 500 or greater, and more preferably have a weight-average molecular weight of 5,000 to 300,000 and a number average molecular weight of 800 to 250,000. The dispersity (weight-average molecular weight/number average molecular weight) of other alkali-soluble resins is preferably 1.1 to 10.

Other alkali-soluble resins included in the resin composition of the present disclosure as desired may be used alone or in combination of two or more kinds thereof.

The content of other alkali-soluble resins is preferably 0% by mass to 98% by mass and more preferably 0% by mass to 80% by mass with respect to the total solid content in the photosensitive resin composition of the present disclosure. In addition, it is preferable that 80 parts by mass or less of other alkali-soluble resin is included with respect to 100 parts by mass of the component A used in the present disclosure.

<Acid Generator>

The photosensitive resin composition of the present disclosure preferably contains an acid generator from the viewpoint of sensitivity improvement.

The acid generator in the present disclosure is a compound which generates an acid by light or heat, and indicates a compound which generates an acid due to decomposition by irradiation with infrared rays or heating at 100° C. or higher. It is preferable that the acid to be generated is a strong acid having a pKa of 2 or less such as sulfonic acid or hydrochloric acid. Due to the acid generated from the acid generator, the permeability of a developer into the image recording layer in the exposed portion is improved and the solubility of the recording layer in an alkali aqueous solution is further improved.

Examples of the acid generator suitably used in the present disclosure include onium salts such as an iodonium salt, a sulfonium salt, a phosphonium salt, and a diazonium salt. Specifically, the compounds described in U.S. Pat. No. 4,708,925A and JP1995-20629A (JP-H07-20629A) can be exemplified. In particular, an iodonium salt, a sulfonium salt, or a diazonium salt, which has a sulfonate ion as a counter ion, is preferable. As the diazonium salt, the diazonium compound described in U.S. Pat. No. 3,867,147A, the diazonium compound described in U.S. Pat. No. 2,632,703A, or the diazo resins described in JP1989-102456A (JP-H01-102456A) or JP1989-102457A (JP-H01-102457A) are also preferable. In addition, the benzyl sulfonates described in U.S. Pat. No. 5,135,838A or U.S. Pat. No. 5,200,544A are also preferable. Furthermore, the active sulfonic esters or the disulfonyl compounds described in JP1990-100054A (JP-H02-100054A), JP1990-100055A (JP-H02-100055A), and JP1996-9444A (JP-H08-9444A) are also preferable. In addition, the haloalkyl-substituted S-triazines described in JP1995-271029A (JP-H07-271029A) are also preferable.

Furthermore, the compound described as an "acid precursor" in JP1996-220752A (JP-H08-220752A) or the compound described as "a compound (a) which can generates an acid by irradiation with active light" in JP1997-171254A (JP-H09-171254A) can also be applied as the acid generator of the present disclosure.

Among these, from the viewpoint of sensitivity and stability, it is preferable to use an onium salt compound as an acid generator. Hereinafter, the onium salt compound will be described.

As the onium salt compound which can be suitably used in the present disclosure, compounds known to be decomposed by exposure to infrared rays or heat energy generated from the infrared absorbent by exposure and generate an acid can be exemplified. As the onium salt compound suitable in the present disclosure, from the viewpoint of sensitivity, compounds which have a known thermal polymerization initiator or a bond with small bond dissociation energy and have an onium salt structure described below can be exemplified.

Examples of the onium salt suitably used in the present disclosure include known diazonium salts, iodonium salts, sulfonium salts, ammonium salts, pyridinium salts, and azinium salts, and among these, a sulfonate of triarylsulfonium or diaryliodonium, a carboxylate, $BF_4^-$, $PF_6^-$, or $ClO_4^-$ is preferable.

Examples of the onium salt which can be used as an acid generator in the present disclosure include onium salts represented by Formulae (III) to (V).

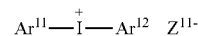
Formula (III)

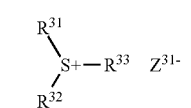
Formula (IV)

Formula (V)

In Formula (III), $Ar^{11}$ and $Ar^{12}$ each independently represent an aryl group having 6 to 20 carbon atoms which may have a substituent. Preferred examples of the substituent in a case where the aryl group has a substituent include a halogen atom, a nitro group, an alkyl group having 1 to 12 carbon atoms, an alkoxy group having 1 to 12 carbon atoms, and an aryloxy group having 6 to 12 carbon atoms. $Z^{11-}$ represents a counter ion selected from the group consisting of a halogen ion, a perchlorate ion, a tetrafluoroborate ion, a hexafluorophosphate ion, a sulfonate ion, and a sulfonate ion having a fluorine atom such as a perfluoroalkyl sulfonate ion. Among these, a counter ion selected from the group consisting of a perchlorate ion, a hexafluorophosphate ion, an aryl sulfonate ion, and a perfluoroalkyl sulfonic acid is preferable.

In Formula (IV), $Ar^{21}$ represents an aryl group having 6 to 20 carbon atoms which may have a substituent. Preferred examples of the substituent include a halogen atom, a nitro group, an alkyl group having 1 to 12 carbon atoms, an alkoxy group having 1 to 12 carbon atoms, an aryloxy group having 6 to 12 carbon atoms, an alkylamino group having 1 to 12 carbon atoms, a dialkylamino group having 2 to 12 carbon atoms, an arylamino group having 6 to 12 carbon atoms, and a diarylamino group having 12 to 24 carbon atoms. $Z^{21-}$ represents a counter ion which has the same definition as that for $Z^{11-}$.

In Formula (V), $R^{31}$, $R^{32}$, and $R^{33}$ may be the same as or different from each other and each represent a hydrocarbon group having 1 to 20 carbon atoms which may have a substituent. Preferred examples of the substituent include a halogen atom, a nitro group, an alkyl group having 1 to 12 carbon atoms, an alkoxy group having 1 to 12 carbon atoms, and an aryloxy group having 6 to 12 carbon atoms. $Z^{31-}$ represents a counter ion which has the same definition as that for $Z^{11-}$.

Specific examples of onium salts (OI-1 to OI-10) represented by Formula (III), onium salts (ON-1 to ON-5) represented by Formula (IV), and onium salts (OS-1 to OS-6) represented by Formula (V) which can be suitably used in the present disclosure are exemplified below.

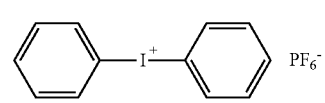
[OI-1]

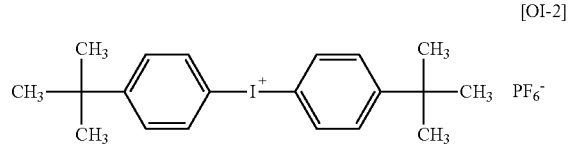
[OI-2]

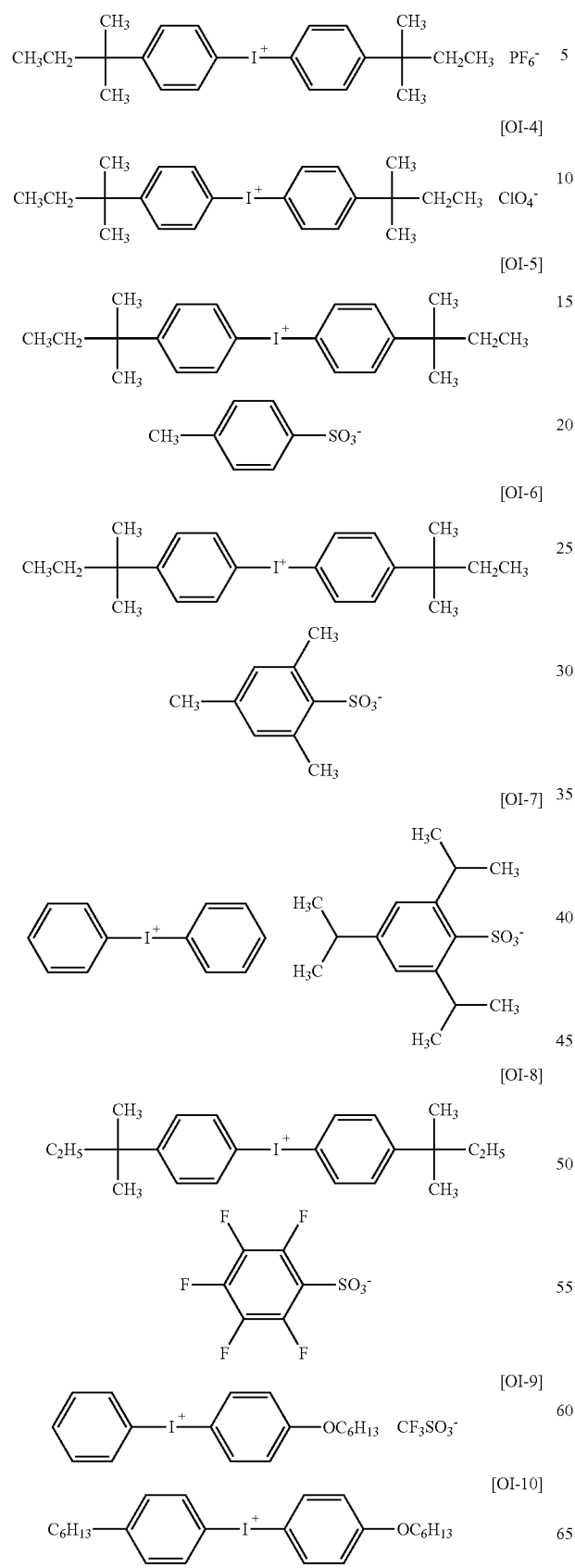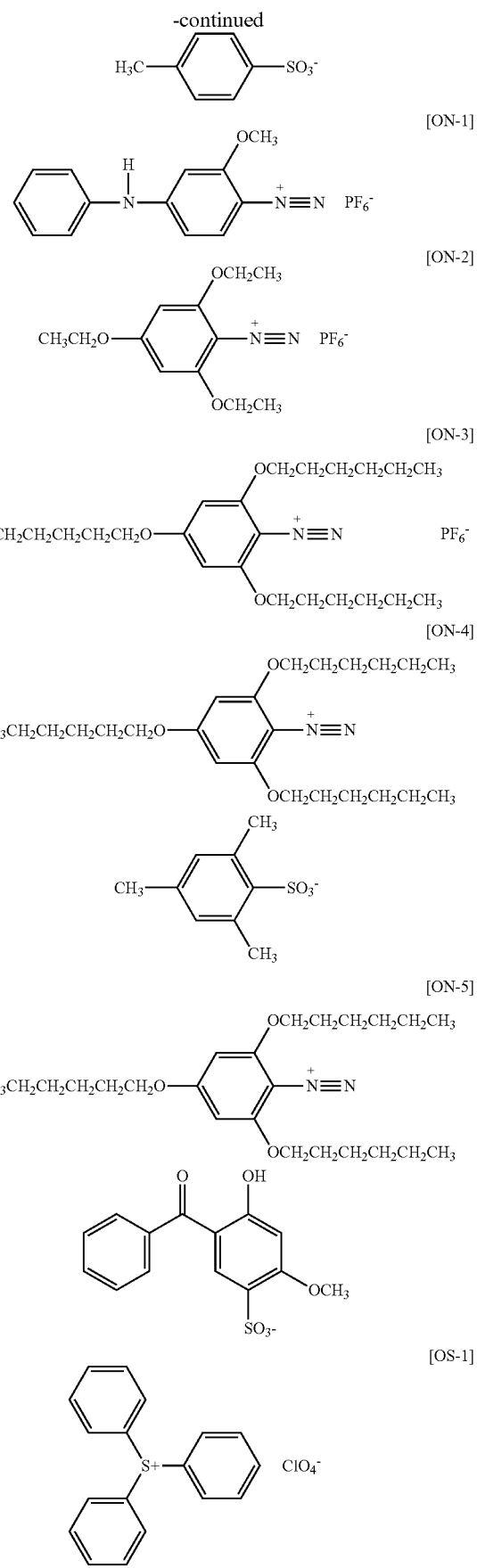

-continued

[OS-2]
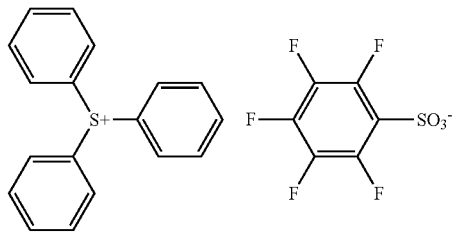

[OS-3]
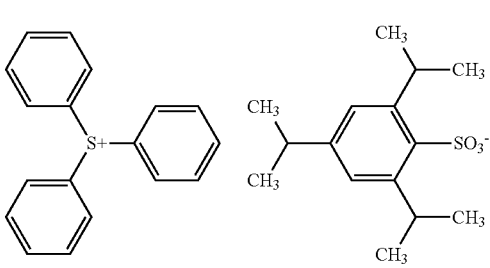

[OS-4]
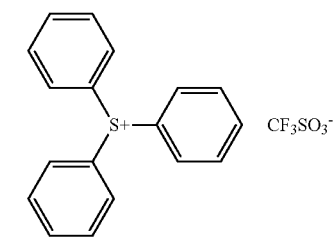

[OS-5]
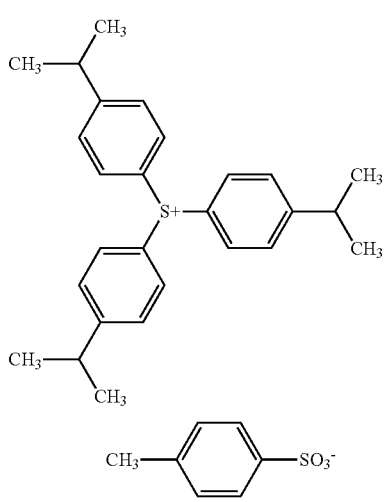

[OS-6]
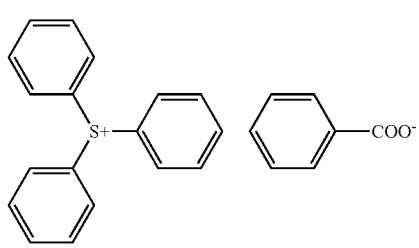

In addition, as other examples of the compounds represented by Formulae (III) to (V), the compounds described, as an example of a radical polymerization initiator, in paragraphs 0036 to 0045 of JP2008-195018A can be suitably used as an acid generator in the present disclosure.

Preferred other examples of the onium salt serving as the acid generator used in the present disclosure include an azinium salt compound represented by Formula (VI).

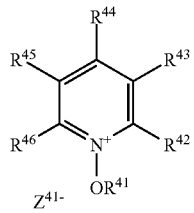

Formula (VI)

In Formula (VI), $R^{41}$, $R^{42}$, $R^{43}$, $R^{44}$, $R^{45}$, and $R^{46}$ may be the same as or different from each other, and $R^{41}$, $R^{42}$, $R^{43}$, $R^{44}$, $R^{45}$, and $R^{46}$ each represent a hydrogen atom, a halogen atom, or a monovalent substituent.

Examples of the monovalent substituent include a halogen atom, an amino group, a substituted amino group, a substituted carbonyl group, a hydroxyl group, a substituted oxy group, a thiol group, a thioether group, a silyl group, a nitro group, a cyano group, an alkyl group, an alkenyl group, an aryl group, a heterocyclic group, a sulfo group, a substituted sulfonyl group, a sulfonate group, a substituted sulfinyl group, a phosphono group, a substituted phosphono group, a phosphonate group, and a substituted phosphonate group, and in the case of being introducible, $R^{41}$, $R^{42}$, $R^{43}$, $R^{44}$, $R^{45}$, and $R^{46}$ each may further have a substituent.

A compound (multimerized form) in which skeletons (cation portions) having a specific structure in the compound represented by Formula (VI) are bonded to each other through $R^{41}$ and which includes two or more cation portions in a molecule is also included in examples of the compound represented by Formula (VI), and such a compound is also suitably used.

$Z^{41-}$ represents a counter ion which has the same definition as that for $Z^{11-}$.

Specific examples of the azinium salt compound represented by Formula (VI) include the compounds described in paragraphs 0047 to 0056 of JP2008-195018A.

In addition, a compound group having an N—O bond described in JP1988-138345A (JP-S63-138345A), JP1988-142345A (JP-S63-142345A), JP1988-142346A (JP-S63-142346A, JP1988-143537A (JP-S63-143537A), or JP1971-42363B (JP-S46-42363B) is also suitably used as the acid generator in the present disclosure.

More preferred examples of the acid generator which can be used in the present disclosure include the following compounds PAG-1 to PAG-5. Further, Me represents a methyl group.

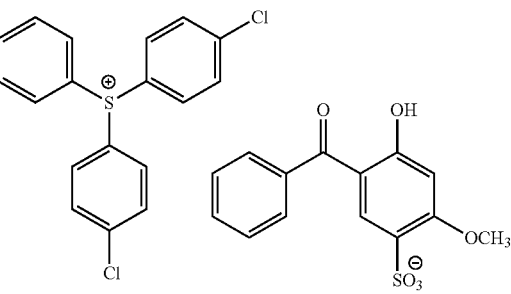

PAG-1

-continued

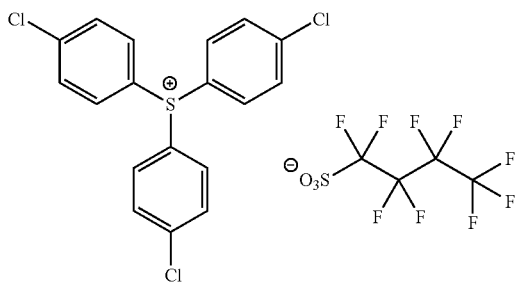

PAG-2

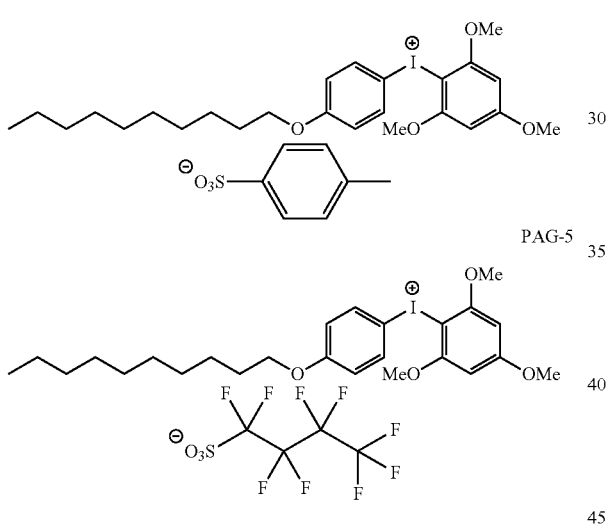

PAG-3

PAG-4

PAG-5

In a case where these acid generators are contained in the photosensitive resin composition of the present disclosure, these compounds may be used alone or in combination of two or more kinds thereof.

The amount of the acid generator to be added is preferably in a range of 0.01% to 50% by mass, more preferably in a range of 0.1% to 40% by mass, and still more preferably in a range of 0.5% to 30% by mass with respect to the total solid content in the photosensitive resin composition. In a case where the amount thereof is in the above-described range, improvement of sensitivity which is the effect of the addition of an acid generator is observed, and an occurrence of a residual film in the non-image area is suppressed.

<Acid Proliferative Agent>

An acid proliferative agent may be added to the photosensitive resin composition of the present disclosure.

The acid proliferative agent in the present disclosure is a compound substituted with a residue of a relatively strong acid and is a compound which newly generates an acid by being easily released in the presence of an acid catalyst. That is, the compound is decomposed by an acid catalytic reaction and generates an acid (hereinafter, referred to as ZOH in the formulae) again. Since one or more acids are increased by one reaction and the acid concentration is acceleratively increased with the progress of the reaction, sensitivity is dramatically improved. The intensity of this generated acid is 3 or less and preferably 2 or less in terms of an acid dissociation constant (pKa). In the case of a weaker acid than this, it is not possible to cause the elimination reaction by an acid catalyst.

Examples of the acid used for such an acid catalyst include dichloroacetic acid, trichloroacetic acid, methanesulfonic acid, ethanesulfonic acid, benzenesulfonic acid, p-toluenesulfonic acid, and naphthalenesulfonic acid.

As the acid proliferative agent, the acid proliferative agents described in WO95/29968A, WO98/24000A, JP1996-305262A (JP-H08-305262A), JP1997-34106A (JP-H09-34106A), JP1996-248561A (JP-H08-248561A), JP1996-503082B (JP-H08-503082B), U.S. Pat. No. 5,445,917A, JP1996-503081B (JP-H08-503081B), U.S. Pat. Nos. 5,534,393A, 5,395,736A, 5,741,630A, 5,334,489A, 5,582,956A, 5,578,424A, 5,453,345A, 5,445,917A, EP665960, EP757628, EP665961, U.S. Pat. No. 5,667,943, or JP1998-1598A (JP-H10-1598A) can be used alone or in combination of two or more kinds thereof.

Preferred specific examples of the acid proliferative agent in the present disclosure include the compounds described in paragraphs 0056 to 0067 of JP2001-66765A. Among these, the following compounds described as exemplary compounds (ADD-1), (ADD-2), and (ADD-3) can be suitably used.

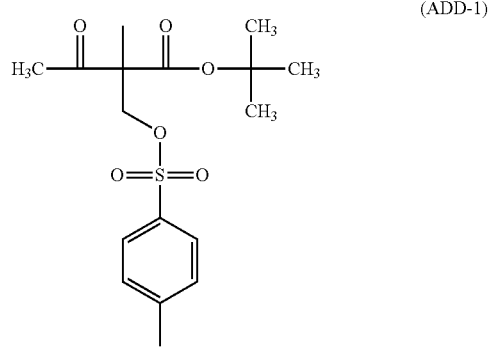

(ADD-1)

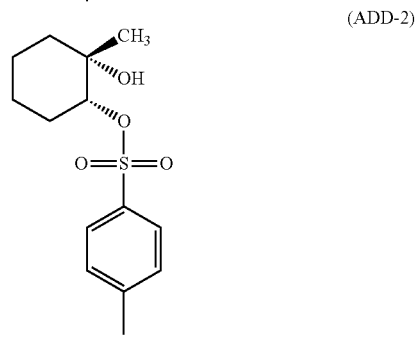

(ADD-2)

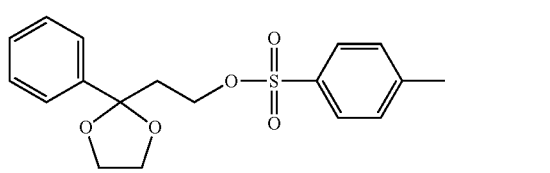

(ADD-3)

The amount of the acid proliferative agent is preferably in a range of 0.01% by mass to 20% by mass, preferably in a range of 0.01% by mass to 10% by mass, and still more preferably in a range of 0.1% by mass to 5% by mass with respect to the total solid content of the photosensitive resin composition. In a case where the amount of the acid proliferative agent to be added is in the above-described range, effects of adding the acid proliferative agent are sufficiently obtained, improvement in sensitivity is achieved, and degradation of film hardness of an image area is suppressed.

<Other Additives>

The photosensitive resin composition of the present disclosure may include a development accelerator, a surfactant, a print-out agent/colorant, a plasticizer, or a wax agent, as other additives.

Further, the photosensitive resin composition of the present disclosure may contain a solvent described below in the planographic printing plate precursor. The concentration of solid contents in the photosensitive resin composition of the present disclosure is not particularly limited, but is preferably in a range of 1% to 50% by mass.

[Development Accelerator]

For the purpose of improving the sensitivity, development accelerators such as acid anhydrides, phenols, and organic acids may be added to the photosensitive resin composition of the present disclosure.

As the acid anhydrides, a cyclic acid anhydride is preferable. Specifically, as the cyclic acid anhydride, phthalic anhydride, tetrahydrophthalic anhydride, hexahydrophthalic anhydride, 3,6-endooxytetrahydrophthalic anhydride, tetrachlorophthalic anhydride, maleic anhydride, chloromaleic anhydride, α-phenylmaleic anhydride, succinic anhydride, or pyromellitic anhydride described in U.S. Pat. No. 4,115,128A can be used. As the non-cyclic acid anhydride, acetic anhydride is exemplified.

Examples of the phenols include bisphenol A, 2,2'-bishydroxysulfone, p-nitrophenol, p-ethoxyphenol, 2,4,4'-trihydroxybenzophenone, 2,3,4-trihydroxyb enzophenone, 4-hydroxybenxophenone, 4,4',4''-trihydroxytriphenyl methane, and 4,4',3'',4'''-tetrahydroxy-3,5,3',5'-tetramethyltriphenyl methane.

The organic acids are described in JP1985-88942A (JP-S60-88942A), JP1990-96755A (JP-H02-96755A), or the like, and specific examples thereof include p-toluenesulfonic acid, dodecylbenzenesulfonic acid, p-toluenesulfinic acid, ethyl sulfate, phenylphosphonic acid, phenylphosphinic acid, phenyl phosphate, diphenyl phosphate, benzoic acid, isophthalic acid, adipic acid, p-toluic acid, 3,4-dimethoxybenzoic acid, phthalic acid, terephthalic acid, 4-cyclohexene-1,2-dicarboxylic acid, erucic acid, lauric acid, n-undecanoic acid, and ascorbic acid.

The proportion of the acid anhydrides, the phenols, and the organic acids is preferably 0.05% by mass to 20% by mass, more preferably 0.1% by mass to 15% by mass, and particularly preferably 0.1% by mass to 10% by mass with respect to the total solid content in the photosensitive resin composition.

[Surfactant]

In order to improve coating properties and stability of a treatment with respect to development conditions, a nonionic surfactant described in JP1987-251740A (JP-S62-251740A) or JP1991-208514A (JP-H03-208514A), an amphoteric surfactant described in JP1984-121044A (JP-S59-121044A) or JP1992-13149A (JP-H04-13149A), or a fluorine-containing monomer copolymer described in JP1987-170950A (JP-S62-170950A), JP1999-288093A (JP-H11-288093A), or JP2003-57820A can be added to the photosensitive resin composition of the present disclosure.

Specific examples of the nonionic surfactant include sorbitan tristearate, sorbitan monopalmitate, sorbitan trioleate, monoglyceride stearate, and polyoxyethylenenonylphenyl ether.

Specific examples of the amphoteric surfactant include alkyl di(aminoethyl)glycine, alkylpolyaminoethylglycine hydrochloride, 2-alkyl-N-carboxyethyl-N-hydroxyethyl imidazolinium betaine, and an N-tetradecyl-N,N-betaine type (for example, product name "AMOGEN K" manufactured by Dai-ichi Kogyo Seiyaku Co., Ltd.).

The proportion of the surfactant is preferably 0.01% by mass to 15% by mass, more preferably 0.01% by mass to 5% by mass, and still more preferably 0.05% by mass to 2.0% by mass with respect to the total solid content in the photosensitive resin composition.

[Print-Out Agent/Colorant]

A print-out agent for obtaining a visible image immediately after performing heating through exposure and a dye or a pigment serving as an image colorant can be added to the photosensitive resin composition of the present disclosure.

Examples of the print-out agent and the colorant are described in detail in paragraphs 0122 and 0123 of JP2009-229917A, and the compounds described herein can be applied to the present disclosure.

The proportion of the print-out agent and the colorant is preferably in a range of 0.01% by mass to 10% by mass and more preferably in a range of 0.1% by mass to 3% by mass with respect to the total solid content of the photosensitive resin composition.

[Plasticizer]

In order to impart flexibility or the like to the coated film, a plasticizer may be added to the photosensitive resin composition of the present disclosure. Examples thereof include butylphthalyl, polyethylene glycol, tributyl citrate, diethyl phthalate, dibutyl phthalate, dihexyl phthalate, dioctyl phthalate, tricresyl phosphate, tributyl phosphate, trioctyl phosphate, tetrahydrofurfuryl oleate, or an oligomer or a polymer of acrylic acid and methacrylic acid.

The proportion of the plasticizer is preferably in a range of 0.5% by mass to 10% by mass and more preferably in a range of 1.0% by mass to 5% by mass with respect to the total solid content of the photosensitive resin composition.

[Wax Agent]

For the purpose of imparting resistance to scratches, a compound (wax agent) that reduces the coefficient of static friction of the surface can also be added to the photosensitive resin composition of the present disclosure. Specific examples thereof include the compounds having an ester of long-chain alkyl carboxylic acid described in U.S. Pat. No. 6,117,913A, JP2003-149799A, JP2003-302750A, or JP2004-12770A.

As the amount of the wax agent to be added, the proportion thereof is preferably in a range of 0.1% to 10% by mass and more preferably in a range of 0.5% to 5% by mass with respect to the total solid content of the photosensitive resin composition.

<Compositional Ratio of Respective Components>

The content of the specific polymer compound is preferably in a range of 10% to 90% by mass, the content of the infrared absorbent is preferably in a range of 0.01% to 50% by mass, the content of other alkali-soluble resins is preferably in a range of 0% to 80% by mass, the content of the acid generator is preferably in a range of 0% to 30% by mass, the content of the acid proliferative agent is preferably in a range of 0% to 20% by mass, the content of the development accelerator is preferably in a range of 0% to 20% by mass, the content of the surfactant is preferably in a range of 0% to 5% by mass, the content of the print-out agent/colorant is preferably in a range of 0% to 10% by mass, the content of the plasticizer is preferably in a range of 0% to 10% by mass, and the content of the wax agent is preferably in a range of 0% to 10% by mass, with respect to the total solid content mass of the photosensitive resin composition of the present disclosure.

The photosensitive resin composition of the present disclosure can be applied to various fields requiring resin pattern formation which is excellent in durability, for example, various fields of a resist, a display, a planographic printing plate precursor, and the like. However, from the viewpoints of capability of recording the photosensitive resin composition with excellent sensitivity, excellent image formability, and excellent durability of the formed image area, it can be said that the effects of the photosensitive resin composition of the present disclosure obtained by application to an infrared-sensitive positive type planographic printing plate precursor described below in detail are significant.

(Planographic Printing Plate Precursor)

The planographic printing plate precursor of the present disclosure includes, on the support, a polymer compound which has a structure represented by Formula 1 as a component A; and a recording layer containing an infrared absorbent as a component B.

In addition, it is preferable that the recording layer is a layer formed by using at least the photosensitive resin composition of the present disclosure.

Further, it is preferable that the planographic printing plate precursor of the present disclosure is a positive type planographic printing plate precursor.

Furthermore, the planographic printing plate precursor of the present disclosure is a positive type planographic printing plate precursor that includes a recording layer having a lower layer and an upper layer in this order on the support having a hydrophilic surface, and it is preferable that any one or both of the lower layer and the upper layer contain the component A and the component B; more preferable that the lower layer or the upper layer contains the component A and the component B; and still more preferable that only the lower layer contains the component A and the component B.

<Recording Layer>

The recording layer in the planographic printing plate precursor of the present disclosure contains the component A and the component B and may further optionally contain an alkali-soluble resin, an acid generator, an acid proliferative agent, a development accelerator, a surfactant, a print-out agent/colorant, a plasticizer, or a wax agent.

Preferred aspects of the component A, the component B, the alkali-soluble resin, the acid generator, the acid proliferative agent, the development accelerator, the surfactant, the print-out agent/colorant, the plasticizer, or the wax agent in the recording layer are the same as the preferred aspects of those additives in the photosensitive resin composition according to the present disclosure described above.

The preferable content of these components in the recording layer is the same as the preferable content of those additives in the photosensitive resin composition of the present disclosure described above with respect to the total solid content of the photosensitive resin composition.

The recording layer used in the present disclosure can be formed by dissolving respective components of the photosensitive resin composition of the present disclosure in a solvent and coating a suitable support with the solution.

Examples of the solvent used here include ethylene dichloride, cyclohexanone, methyl ethyl ketone, methanol, ethanol, propanol, ethylene glycol monomethyl ether, 1-methoxy-2-propanol, 2-methoxyethyl acetate, 1-methoxy-2-propyl acetate, dimethoxyethane, methyl lactate, ethyl lactate, N,N-dimethylacetamide, N,N-dimethylformamide, tetramethyl urea, N-methylpyrrolidone, dimethyl sulfoxide, sulfolane, γ-butyrolactone, and toluene, and the present disclosure is not limited to these. These solvents are used alone or in a mixture.

<Formation of Lower Layer and Upper Layer>

It is preferable that the recording layer of the planographic printing plate precursor of the present disclosure is a recording layer (hereinafter, also referred to as a "planographic printing plate precursor having a two-layer structure") having a lower layer and an upper layer in this order on a support.

It is preferable that the lower layer and the upper layer are separately formed in principle.

Examples of the method of separately forming two layers include a method of using a difference in solvent solubility between the components included in the lower layer and the components included in the upper layer; and a method of rapidly drying and removing the solvent after the upper layer is coated with the solvent. It is preferable that the latter method is used together because the separation between the layers is more favorably performed.

Hereinafter, these methods will be described in detail, but the method of separating two layers and performing application is not limited to these.

According to the method of using a difference in solvent solubility between the components in the lower layer and the components contained in the upper layer, a solvent system in which all components contained in the lower layer are insoluble is used at the time of application of a coating solution for an upper layer. In this manner, it becomes possible for respective layers to be clearly separated to obtain a coated film even though two-layer-coating is performed. For example, two layers can be formed by selecting, as a lower layer component, a component insoluble in a solvent such as methyl ethyl ketone or 1-methoxy-2-propanol that dissolves an alkali-soluble resin serving as an upper layer component, coating and drying the lower layer with a solvent system that dissolves the lower layer component, dissolving the upper layer mainly containing an alkali-soluble resin in methyl ethyl ketone or 1-methoxy-2-propanol, and performing application and drying.

Next, as the method of drying the solvent extremely rapidly after the second layer (upper layer) is coated with the solvent, a method of blowing pressurized air from a slit nozzle disposed at an approximately right angle with respect to a travelling direction of a web; a method of providing heat energy as conduction heat from the lower surface of the web using a roll (heating roll) to which a heating medium such as steam has been supplied; or a method of combining these can be used.

It is preferable that any one or both of the upper layer and the lower layer contain the photosensitive resin composition of the present disclosure and more preferable that only the lower layer contains the photosensitive resin composition of the present disclosure.

The coating amount after drying of the lower layer component to be applied to the support of the planographic printing plate precursor of the present disclosure is preferably in a range of 0.5 to 4.0 g/m$^2$ and more preferably in a range of 0.6 to 2.5 g/m$^2$. In a case where the coating amount is 0.5 g/m$^2$ or greater, printing durability is excellent. Further, in a case where the coating amount is 4.0 g/m² or less, image reproducibility and sensitivity are excellent.

In addition, the coating amount after drying of the upper layer component is preferably in a range of 0.05 to 1.0 g/m² and more preferably in a range of 0.08 to 0.7 g/m². In a case where the coating amount is 0.05 g/m² or greater, development latitude and scratch resistance are excellent. Further, in a case where the coating amount is 1.0 g/m² or less, sensitivity is excellent.

The coating amount after drying of the lower layer and the upper layer is preferably in a range of 0.6 to 4.0 g/m² and more preferably in a range of 0.7 to 2.5 g/m². In a case where the coating amount is 0.6 g/m² or greater, printing durability is excellent. Further, in a case where the coating amount is 4.0 g/m² or less, image reproducibility and sensitivity are excellent.

<Upper Layer>

The upper layer of the planographic printing plate precursor having a two-layer structure of the present disclosure can be also formed using the photosensitive resin composition of the present disclosure, but it is preferable that the upper layer is formed using a resin composition other than the photosensitive resin composition of the present disclosure.

It is preferable that the upper layer of the planographic printing plate precursor having a two-layer structure of the present disclosure is an infrared-sensitive positive type recording layer in which the solubility in an alkali aqueous solution is improved by heat.

The mechanism of improving the solubility in an alkali aqueous solution by heat in the upper layer is not particularly limited, and any one can be used as long as it includes a binder resin and improves the solubility of the heated region. As the heat used for image formation, the heat generated in a case where the lower layer including an infrared absorbent is exposed is exemplified.

Preferable examples of the upper layer in which the solubility in an alkali aqueous solution is improved by heat include a layer including an alkali-soluble resin having hydrogen-bonding capacity such as novolac or urethane; a layer including a water-insoluble and alkali-soluble resin and a compound having a dissolution suppressing action; and a layer including a compound that is capable of ablation.

In addition, the heat generated from the upper layer can also be used for image formation by further adding an infrared absorbent to the upper layer. Preferred examples of the configuration of the upper layer containing an infrared absorbent include a layer containing an infrared absorbent, a water-insoluble and alkali-soluble resin, and a compound having a dissolution suppressing action, and a layer containing an infrared absorbent, a water-insoluble and alkali-soluble resin, and an acid generator.

[Water-Insoluble and Alkali-Soluble Resin]

It is preferable that the upper layer in the recording layer contains a water-insoluble and alkali-soluble resin. By containing the water-insoluble and alkali-soluble resin, an interaction is formed between the infrared absorbent and a polar group contained in the water-insoluble and alkali-soluble resin, and a layer having a positive type photosensitivity is formed.

Typical water-insoluble and alkali-soluble resin will be described below in detail, and among these, a polyamide resin, an epoxy resin, a polyacetal resin, an acrylic resin, a methacrylic resin, a polystyrene-based resin, and a novolac-type phenolic resin are preferably exemplified.

The water-insoluble and alkali-soluble resin which can be used in the present disclosure is not particularly limited as long as the resin has a characteristic in which the resin is dissolved at the time of being brought into contact with an alkali developer, and a homopolymer containing an acidic group in the main chain and/or a side chain in the polymer, a copolymer thereof, or a mixture thereof is preferable.

It is preferable that the water-insoluble and alkali-soluble resin having an acidic group contains a functional group such as a phenolic hydroxyl group, a carboxy group, a sulfonate group, a phosphate group, a sulfonamide group, or an active imide group. Therefore, such a resin can be suitably produced by copolymerizing a monomer mixture including one or more ethylenically unsaturated monomers having a functional group described above. Preferred examples of the ethylenically unsaturated monomer containing a functional group described above include compounds represented by the following formulae and mixtures thereof, in addition to acrylic acid and methacrylic acid. Moreover, in the following formulae, $R^{40}$ represents a hydrogen atom or a methyl group.

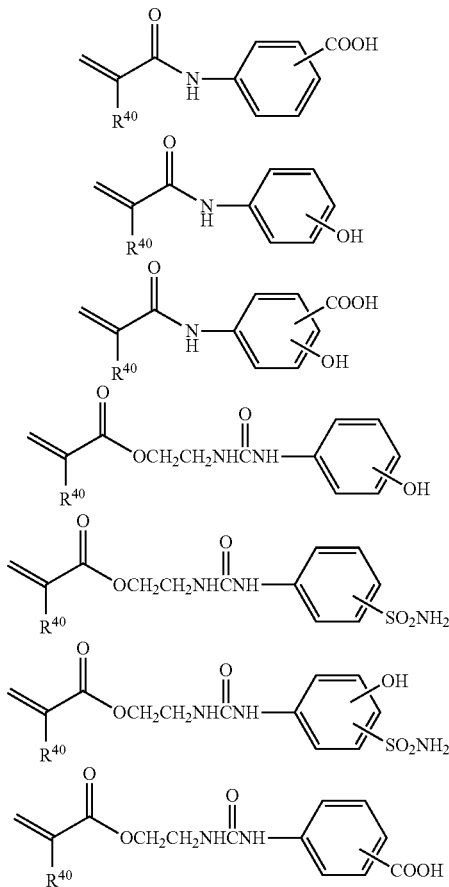

As the water-insoluble and alkali-soluble resin which can be used in the present disclosure, a polymer compound obtained by copolymerizing other polymerizable monomers in addition to the above-described polymerizable monomers is preferable. As the copolymerization ratio in this case, a monomer imparting alkali-solubility such as a monomer having a functional group such as a phenolic hydroxyl group, a carboxy group, a sulfonate group, a phosphate group, a sulfonamide group, or an active imide group is included preferably at a copolymerization ratio of 10% by mole or greater and more preferably 20% by mole or greater.

In a case where the copolymerization component of the monomer imparting alkali-solubility is 10% by mole or greater, alkali-solubility is sufficiently obtained, and developability is excellent.

Examples of other usable polymerizable monomers include compounds exemplified below.

Examples thereof include alkyl acrylates or alkyl methacrylates such as methyl acrylate, ethyl acrylate, propyl acrylate, benzyl acrylate, methyl methacrylate, ethyl methacrylate, cyclohexyl methacrylate, and benzyl methacrylate; acrylic acid esters or methacrylic acid esters having an aliphatic hydroxy group such as 2-hydroxyethyl acrylate and 2-hydroxyethyl methacrylate; acrylamides or methacrylamides such as acrylamide, methacrylamide, N-methylacrylamide, N-ethylacrylamide, and N-phenylacrylamide; vinyl esters such as vinyl acetate, vinyl chloroacetate, vinyl butyrate, and vinyl benzoate; styrenes such as styrene, a-methyl styrene, methyl styrene, and chloromethyl styrene; other nitrogen atom-containing monomers such as N-vinyl pyrrolidone, N-vinyl pyridine, acrylonitrile, and methacrylonitrile; maleimides such as N-methylmaleimide, N-ethylmaleimide, N-propylmaleimide, N-butylmaleimide, N-phenylmaleimide, N-2-methylphenylmaleimide, N-2,6-diethylphenylmaleimide, N-2-chlorophenylmaleimide, N-cyclohexylmaleimide, N-laurylmaleimide, and N-hydroxyphenylmaleimide.

Among these other ethylenically unsaturated monomers, (meth)acrylic acid esters, (meth)acrylamides, maleimides, and (meth)acrylonitrile are suitably used.

In addition, as the alkali-soluble resin, a novolac resin exemplified as one of other alkali-soluble resins mentioned as arbitrary components of the photosensitive resin composition of the present disclosure may also be preferably exemplified.

In addition, the water-insoluble and alkali-soluble resin described above can also be used for the resin composition of the present disclosure.

Furthermore, in the upper layer of the present disclosure, other resins can be used in combination within a range not impairing the effects of the planographic printing plate precursor of the present disclosure. Since the upper layer is required to exhibit alkali-solubility, particularly, in a non-image area region, it is necessary to select a resin which does not impair this characteristic. From this viewpoint, a water-insoluble and alkali-soluble resin is exemplified as a resin which can be used in combination. A typical water-insoluble and alkali-soluble resin will be described below in detail. Among examples of the resin, a polyamide resin, an epoxy resin, a polyacetal resin, an acrylic resin, a methacrylic resin, a polystyrene-based resin, and a novolac-type phenolic resin are preferably exemplified.

In addition, the amount of the resin to be mixed is preferably 50% by mass or less with respect to the water-insoluble and alkali-soluble resin.

The weight-average molecular weight and the number average molecular weight of the water-insoluble and alkali-soluble resin are respectively preferably 2,000 or greater and 500 or greater and more preferably in a range of 5,000 to 300,000 and in a range of 800 to 250,000. The dispersity (weight-average molecular weight/number average molecular weight) of the alkali-soluble resin is preferably in a range of 1.1 to 10.

The alkali-soluble resin in other resin compositions may be used alone or in combination of two or more kinds thereof.

The content of the alkali-soluble resin is preferably in a range of 2.0% to 99.5% by mass, more preferably in a range of 10.0% to 99.0% by mass, and still more preferably in a range of 20.0% to 90.0% by mass with respect to the total solid content in other resin compositions of the present disclosure. In a case where the amount of the alkali-soluble resin to be added is 2.0% by mass or greater, the durability of a recording layer (photosensitive layer) is excellent. In a case where the amount of the alkali-soluble resin to be added is 99.5% by mass or less, both the sensitivity and the durability are excellent.

[Infrared Absorbent]

Other resin compositions described above may contain an infrared absorbent.

The infrared absorbent is not particularly limited as long as the infrared absorbent is a dye which generates heat by absorbing infrared light, and the infrared absorbent used in the photosensitive resin composition of the present disclosure described above can also be used.

A cyanine dye represented by Formula (a) is particularly preferable as the dye.

In a case where the upper layer contains an infrared absorbent, sensitivity becomes excellent.

The amount of the infrared absorbent to be added to the upper layer is preferably in a range of 0.01% to 50% by mass, more preferably in a range of 0.1% to 30% by mass, and particularly preferably in a range of 1.0% to 10% by mass with respect to the total solid content in the upper layer. In a case where the amount of the infrared absorbent to be added is 0.01% by mass or greater, the sensitivity is improved. Further, in a case where the amount of the infrared absorbent to be added is 50% by mass or less, the uniformity of the layer is excellent and the durability of the layer is excellent.

[Other Components]

In addition, the upper layer of the planographic printing plate precursor having a two-layer structure may contain an acid generator, an acid proliferative agent, a development accelerator, a surfactant, a print-out agent/colorant, a plasticizer, or a wax agent. Respective components used in the resin composition of the present disclosure described above can also be used as these components, and preferred aspects thereof are also the same as the aspects of the respective components used in the resin composition.

<Lower Layer>

It is preferable that the lower layer of the planographic printing plate precursor having a two-layer structure in the present disclosure is formed by being coated with the photosensitive resin composition of the present disclosure.

By using the photosensitive resin composition of the present disclosure for the lower layer, a printing plate having excellent image formability and printing durability can be obtained.

In a case where materials such as ink and paper having particularly poor quality are used, the printing durability is improved by using the photosensitive resin composition of the present disclosure for the lower layer.

Although the detailed mechanism by which the effects as described above are obtained is unclear, it is assumed that the film hardness of the resin used in the lower layer is important for the printing durability in printing. Accordingly, it is assumed that the printing durability is improved by using the photosensitive resin composition of the present disclosure having a high film hardness for the lower layer because an interaction (a hydrogen bond or the like) between binders is strong.

In a case where the photosensitive resin composition of the present disclosure is used for the upper layer, it is preferable that the lower layer is also formed of the photosensitive resin composition of the present disclosure, but the lower layer may be formed using a resin composition other than the photosensitive resin composition of the present disclosure. The preferred aspects of the lower layer in this case are the same as the preferred aspect of the upper layer described above.

<Support>

The support used in the planographic printing plate precursor of the present disclosure is not particularly limited as long as the support is a dimensionally stable plate-shaped material having necessary strength and durability, and examples thereof include paper, paper on which plastic (for example, polyethylene, polypropylene, or polystyrene) has been laminated, a metal plate (for example, aluminum, zinc, or copper), a plastic film (for example, cellulose diacetate, cellulose triacetate, cellulose propionate, cellulose butyrate, cellulose acetate butyrate, cellulose nitrate, polyethylene terephthalate, polyethylene, polystyrene, polypropylene, polycarbonate, or polyvinyl acetal), and paper or a plastic film on which the above-described metals have been laminated or vapor-deposited.

Moreover, as the support in a case where the image forming material of the present disclosure is applied to a planographic printing plate precursor, a polyester film or an aluminum plate is preferable. Among these, the aluminum plate which has excellent dimensional stability and is relatively inexpensive is particularly preferable. A suitable aluminum plate is a pure aluminum plate or an alloy plate which has aluminum as a main component and includes a small amount of other elements, or may be a plastic film on which aluminum has been laminated or vapor-deposited. Examples of other elements included in the aluminum alloy include silicon, iron, manganese, copper, magnesium, chromium, zinc, bismuth, nickel, and titanium. The content of other elements in the alloy is preferably 10% by mass or less.

In the present disclosure, particularly suitable aluminum is pure aluminum. However, it is difficult to produce completely pure aluminum using a refining technique, and thus other elements may be slightly contained.

The composition of the aluminum plate applied to the present disclosure as described above is not particularly limited, and aluminum plates formed of known and used materials of the related art can be appropriately used. The thickness of the aluminum plate used in the present disclosure is preferably in a range of 0.1 to 0.6 mm, more preferably in a range of 0.15 to 0.4 mm, and still more preferably in a range of 0.2 to 0.3 mm.

Such an aluminum plate may be subjected to a surface treatment such as a surface-roughening treatment and an anodization treatment, as necessary. As the surface treatment of the aluminum support, for example, a degreasing treatment using a surfactant, an organic solvent, or an alkaline aqueous solution; a surface roughening treatment; or an anodization treatment, described in detail in paragraphs 0167 to 0169 of JP2009-175195A, is suitably performed.

The aluminum surface on which an anodization treatment has been performed may be subjected to a hydrophilizing treatment, as necessary.

As the hydrophilizing treatment, an alkali metal silicate (for example, a sodium silicate aqueous solution) method, a method of performing a treatment using potassium fluoride zirconate or polyvinylphosphonic acid, or the like disclosed in paragraph 0169 of 2009-175195, is used.

In addition, the supports described in JP2011-245844A are also preferably used.

<Undercoat Layer (Interlayer)>

It is preferable that the planographic printing plate precursor of the present disclosure includes an undercoat layer (interlayer) between the support and the recording layer, as necessary.

As the undercoat layer component, various organic compounds can be used, and preferred examples thereof include phosphonic acids having an amino group such as carboxymethyl cellulose or dextrin, an organic phosphonic acid, an organic phosphorus acid, an organic phosphinic acid, amino acids, and hydrochloride of an amine having a hydroxy group. In addition, these undercoat layer components may be used alone or in combination of two or more kinds thereof. Details of the compound used for an undercoat layer and the method of forming an undercoat layer are described in paragraphs 0171 and 0172 of JP2009-175195A, and the description thereof is also applied to the present disclosure.

The amount of forming the undercoat layer is preferably in a range of 2 to 200 mg/m$^2$ and more preferably in a range of 5 to 100 mg/m$^2$. In a case where the amount of forming the undercoat layer is in the above-described range, sufficient printing durability is obtained.

<Back Coat Layer>

A back coat layer is provided on the rear surface of the support of the planographic printing plate precursor of the present disclosure, as necessary. As the back coat layer, a coating layer formed of an organic polymer compound described in JP1993-45885A (JP-H05-45885A) or a metal oxide obtained by hydrolyzing and polycondensing an organic or inorganic metal compound described in JP1994-35174A (JP-H06-35174A) is preferably used. Among these coating layers, alkoxy compounds of silicon such as $Si(OCH_3)_4$, $Si(OC_2H_5)_4$, $Si(OC_3H_7)_4$, and $Si(OC_4H_9)_4$ are particularly preferable from the viewpoint that these compounds are easily available at low cost and coating layers of metal oxides obtained from these have excellent developer resistance.

(Plate-Making Method for Planographic Printing Plate)

The plate-making method for the planographic printing plate of the present disclosure includes an exposure step of image-exposing the planographic printing plate precursor of the present disclosure; and a development step of developing the exposed planographic printing plate precursor using an alkali aqueous solution having a pH of 8.5 to 13.5 in this order.

According to the plate-making method for the planographic printing plate of the present disclosure, a planographic printing plate with excellent printing durability and chemical resistance can be obtained and alkali aqueous solution developability is excellent.

Hereinafter, each step of the plate-making method for the planographic printing plate of the present disclosure will be described in detail.

<Exposure Step>

The plate-making method for the planographic printing plate of the present disclosure includes an exposure step of image-exposing the planographic printing plate precursor of the present disclosure.

In the exposure step, image exposure can be performed in an arbitrary shape such that a desired image is formed.

As a light source of active light rays used for image exposure of the planographic printing plate precursor of the present disclosure, a light source having an emission wavelength from the near infrared region to the infrared region is preferable; and a solid laser or a semiconductor laser is more preferable. Among these, in the present disclosure, it is particularly preferable that image exposure is performed using a solid laser or a semiconductor laser emitting infrared rays having a wavelength of 750 to 1,400 nm.

The output of the laser is preferably 100 mW or greater. In order to shorten the exposure time, it is preferable to use a multibeam laser device. In addition, the exposure time per pixel is preferably within 20 μseconds.

The energy to be applied to the planographic printing plate precursor is preferably in a range of 10 to 300 mJ/cm$^2$. In a case where the energy is in the above-described range, the curing is sufficiently promoted, the laser ablation is suppressed, and damage to an image can be prevented.

The exposure in the present disclosure can be carried out by overlapping a light beam of the light source. The overlapping means that the sub-scanning pitch width is smaller than the beam diameter. For example, in a case where the beam diameter is expressed by the half-width (FWHM) of the beam intensity, the overlapping can be quantitatively expressed by FWHM/sub-scanning pitch width (overlap coefficient). In the present disclosure, this overlap coefficient is preferably 0.1 or greater.

A scanning method of the light source of an exposure device which can be used in the present disclosure is not particularly limited, and examples thereof include a drum outer surface scanning method, a drum inner surface scanning method, and a planar scanning method. In addition, the channel of the light source may be a single channel or a multichannel, and the multichannel is preferably used in a case of drum outer surface scanning method.

<Development Step>

The plate-making method for the planographic printing plate of the present disclosure includes a development step of developing the exposed planographic printing plate precursor using an alkali aqueous solution (hereinafter, also referred to as "developer") with a pH of 8.5 to 13.5.

The developer used in the development step is an aqueous solution having a pH of 8.5 to 13.5 and preferably an alkali aqueous solution having a pH of 12 to 13.5. A surfactant contributes to improvement of processability.

As the surfactant used for the developer, any of an anionic surfactant, a nonionic surfactant, a cationic surfactant, and an amphoteric surfactant can be used, but an anionic surfactant or a nonionic surfactant is preferable as described above.

As the anionic surfactant, the nonionic surfactant, the cationic surfactant, and the amphoteric surfactant used for the developer of the present disclosure, the surfactants described in paragraphs 0128 to 0131 of JP2013-134341A can be used.

In addition, from the viewpoints of stable solubility in water and turbidity, a surfactant has a hydrophile-lipophile balance (HLB) value of preferably 6 or greater and more preferably 8 or greater.

As the surfactant used in the developer, an anionic surfactant or a nonionic surfactant is preferable; and an anionic surfactant containing sulfonic acid or a sulfonate or a nonionic surfactant having an aromatic ring and an ethylene oxide chain is particularly preferable.

The surfactant may be used alone or in combination of two or more kinds thereof.

The content of the surfactant in the developer is preferably in a range of 0.01% to 10% by mass and more preferably in a range of 0.01% to 5% by mass.

In order to maintain the pH of the developer at 8.5 to 13.5, a variation in pH can be suppressed even in a case where the developer is used for a long period of time, and degradation of developability and occurrence of development scum due to the variation in pH can be suppressed in a case where carbonate ions or hydrogen carbonate ions present as a buffer. In order to allow carbonate ions and hydrogen carbonate ions to be present in the developer, carbonate and hydrogen carbonate may be added to the developer or carbonate ions and hydrogen carbonate ions may be generated by adjusting the pH after a carbonate or a hydrogen carbonate is added. The carbonate and the hydrogen carbonate are not particularly limited, but an alkali metal salt is preferable. Examples of the alkali metal include lithium, sodium, and potassium. Among these, sodium is particularly preferable. These may be used alone or in combination of two or more kinds thereof.

The total content of the carbonate and the hydrogen carbonate is preferably in a range of 0.3% to 20% by mass, more preferably in a range of 0.5% to 10% by mass, and particularly preferably in a range of 1% to 5% by mass with respect to the total mass of the developer. In a case where the total amount is 0.3% by mass or greater, the developability and processing capability are sufficient. Further, in a case where the total amount is 20% by mass or less, a precipitate or a crystal is less likely to be generated, and gelation during neutralizing is less likely to occur at the time of the waste liquid treatment of the developer. Therefore, the waste liquid treatment is easily performed.

For the purpose of finely adjusting the alkali concentration or assisting dissolution of the non-image area photosensitive layer, other alkali agents such as organic alkali agents may be supplementarily used in combination. Examples of the organic alkali agent include monomethylamine, dimethylamine, trimethylamine, monoethylamine, diethylamine, triethylamine, monoisopropylamine, diisopropylamine, triisopropylamine, n-butylamine, monoethanolamine, diethanolamine, triethanolamine, monoisopropanolamine, diisopropanolamine, ethyleneimine, ethylenediamine, pyridine, and tetramethylammonium hydroxide. These alkali agents are used alone or in combination of two or more kinds thereof.

The developer may contain a wetting agent, a preservative, a chelating compound, an anti-foaming agent, an organic acid, an organic solvent, an inorganic acid, an inorganic salt, or the like in addition to those described above. In a case where a water-soluble polymer compound is added, the plate surface is likely to be sticky at the time of the developer being fatigued. Accordingly, it is preferable that a water-soluble polymer compound is not added.

As the wetting agent, the wetting agents described in paragraph 0141 of JP2013-134341A can be suitably used. The wetting agent may be used alone or in combination of two or more kinds thereof. The amount of the wetting agent to be added is preferably in a range of 0.1% to 5% by mass with respect to the total mass of the developer.

As the preservative, the preservatives described in paragraph 0142 of JP2013-134341A can be suitably used. It is preferable that two or more preservatives are used in combination such that the preservatives can affect various molds and of sterilization. The amount of the preservative to be added is an amount in which the effect is stably exhibited on bacteria, fungi, yeast or the like. The amount of the preservative to be added varies depending on the kind of bacteria, fungi, or yeast, but the amount thereof is preferably in a range of 0.01% to 4% by mass with respect to the total mass of the developer.

As the chelate compound, the chelate compounds described in paragraph 0143 of JP2013-134341A can be suitably used. A chelating agent which is stably present in the developer composition and does not impair the printability is selected as the chelating agent. The amount of the chelating agent to be added is preferably in a range of 0.001% to 1.0% by mass with respect to the total mass of the developer.

As the anti-foaming agent, the anti-foaming agents described in paragraph 0144 of JP2013-134341A can be suitably used. The content of the anti-foaming agent is preferably in a range of 0.001% to 1.0% by mass with respect to the total weight of the developer.

As the organic acid, the organic acids described in paragraph 0145 of JP2013-134341A can be suitably used. The content of the organic acid is preferably in a range of 0.01% to 0.5% by mass with respect to the total mass of the developer.

Examples of the organic solvent include aliphatic hydrocarbons (hexane, heptane, "Isopar E, H, G" (manufactured by Exxon Chemical Company), gasoline, kerosene, and the like), aromatic hydrocarbons (toluene, xylene, and the like), halogenated hydrocarbons (methylene dichloride, ethylene dichloride, trichlene, monochlorobenzene, and the like), and polar solvents.

Examples of the polar solvent include alcohols (methanol, ethanol, propanol, isopropanol, benzyl alcohol, ethylene glycol monomethyl ether, 2-ethoxyethanol, and the like), ketones (methyl ethyl ketone, cyclohexanone, and the like), esters (ethyl acetate, methyl lactate, propylene glycol monomethyl ether acetate, and the like), and others (triethyl phosphate, tricresyl phosphate, N-phenylethanolamine, N-phenyldiethanolamine, and the like).

In a case where the organic solvent is insoluble in water, it is also possible to use the organic solvent by making the organic solvent soluble in water using a surfactant or the like. In a case where the developer contains an organic solvent, from the viewpoints of safety and inflammability, the concentration of the solvent is preferably less than 40% by mass.

Examples of the inorganic acid and the inorganic salt include phosphoric acid, metaphosphoric acid, ammonium primary phosphate, ammonium secondary phosphate, sodium primary phosphate, sodium secondary phosphate, potassium primary phosphate, potassium secondary phosphate, sodium tripolyphosphate, potassium pyrophosphate, sodium hexametaphosphate, magnesium nitrate, sodium nitrate, potassium nitrate, ammonium nitrate, sodium sulfate, potassium sulfate, ammonium sulfate, sodium sulfite, ammonium sulfite, sodium hydrogen sulfate, and nickel sulfate. The content of the inorganic salt is preferably in a range of 0.01% to 0.5% by mass with respect to the total mass of the developer.

The temperature of development is not particularly limited as long as the development can be carried out, but the temperature is preferably 60° C. or lower and more preferably in a range of 15° C. to 40° C. In the development treatment using an automatic developing device, since the developer becomes fatigued according to the treatment amount, the processing capability may be restored using a replenisher or a fresh developer. By automatically setting a reference conductivity, which determines the timing of replenishing a development replenisher, to a suitable value using an automatic developing device as described in JP1997-96910A (JP-H09-96910A) in consideration of the ratio between the processing fatigue and the carbonic acid gas fatigue, the activity of the developer may be maintained in an excellent state for a long period of time. As one example of the development or a treatment after the development, a method of performing alkali development, removing the alkali in a post-water washing step, performing a gum treatment in a gumming step, and performing drying in a drying step can be exemplified. As another example, a method of performing pre-water washing, development, and gumming at the same time using an aqueous solution containing carbonate ions, hydrogencarbonate ions, and a surfactant can be preferably exemplified. Thus, the pre-water washing step may not be performed, and it is preferable to perform the drying step after pre-water washing, developing, and gumming are performed in one bath only by using one solution. After the development, it is preferable to perform drying after the excess developer is removed using a squeeze roller or the like. In a case where an unnecessary image area is present in the obtained planographic printing plate, deletion of the unnecessary image area is performed. As such a deletion method, for example, a method of coating an unnecessary image area with a deletion fluid described in JP1990-13293B (JP-H02-13293B) and washing the area with water after the area is allowed to stand is preferable; and a method of irradiating an unnecessary image area with active light rays introduced through an optical fiber described in JP1993-174842A (JP-H05-174842A) and performing development can also be used.

The development step can be suitably performed using an automatic processing machine provided with a rubbing member. Examples of the automatic processing machine include an automatic processing machine which performs a rubbing treatment while transporting a planographic printing plate precursor after image exposure, described in JP1990-220061A (JP-H02-220061A) and JP1985-59351A (JP-S60-59351A); and an automatic processing machine which performs a rubbing treatment on a planographic printing plate precursor after image exposure, set on a cylinder while rotating the cylinder, described in U.S. Pat. No. 5,148,746A, 5,568,768A, and GB2297719B. Among these, an automatic processing machine using a rotating brush roll as the rubbing member is particularly preferable.

The rotating brush roller used in the present disclosure can be suitably selected in consideration of the difficulty in flawing of the image area and the stiffness of the support of the planographic printing plate precursor. As the rotating brush roll, a known rotating brush roll formed by implanting a brush material into a plastic or metal roll can be used. For example, brush rolls described in JP1983-159533A (JP-S58-159533A) or JP1991-100554A (JP-H03-100554A) or a brush roll formed by tightly wrapping a metal or plastic grooved material into which a brush material has been implanted in a row on a plastic or metal roll which becomes a core, described in JP1987-167253Y (JP-S62-167253Y), can be used.

As the brush material, plastic fibers (for example, polyester-based synthetic fibers such as polyethylene terephthalate and polybutylene terephthalate; polyamide-based synthetic fibers such as nylon 6.6 and nylon 6.10; polyacryl-based synthetic fibers such as polyacrylonitrile and polyalkyl(meth)acrylate; and polyolefin-based synthetic fibers such as polypropylene and polystyrene) can be used. For example, a plastic fiber having a diameter of a fiber hair of 20 to 400 μm and a length of a hair of 5 to 30 mm can be suitably used.

The outer diameter of the rotating brush roll is preferably in a range of 30 to 200 mm, and the rotation speed of the front end of the brush that rubs the plate surface is preferably in a range of 0.1 to 5 m/sec. A plurality of the rotating brush rolls are preferably used.

The rotation direction of the rotating brush roll may be a direction which is the same as or opposite to the transporting direction of the planographic printing plate precursor, but it is preferable that at least one rotating brush roll rotates in the same direction and at least one rotating brush roll rotates in the opposite direction in a case where two or more rotating brush rolls are used. In this manner, the photosensitive layer of the non-image area is more reliably removed. Furthermore, it is also effective to swing the rotating brush roller in the rotation axis direction of the brush roll.

It is preferable that a continuous or discontinuous drying step of drying the obtained planographic printing plate is performed after the development step. Drying is performed using hot air, infrared rays, or far infrared rays.

As the automatic processing machine suitably used for the plate-making method for the planographic printing plate of the present disclosure, a device which includes a developing unit and a drying unit is used. Further, development and gumming are performed in a developer tank with respect to a planographic printing plate precursor and then the drying unit is dried to obtain a planographic printing plate.

For the purpose of improving printing durability or the like, the printing plate after development can be heated under extremely severe conditions. The heating temperature is preferably in a range of 200° C. to 500° C. In a case where the temperature is low, sufficient image strengthening effects cannot be obtained. Further, in a case where the temperature is extremely high, problems of deterioration of the support and thermal decomposition of the image area may occur.

The planographic printing plate obtained in this manner is mounted on an offset printing machine and suitably used for printing a large number of sheets.

EXAMPLES

Hereinafter, embodiments of the present invention will be described in detail with reference to examples, but the present disclosure is not limited to these. Moreover, "part" and "%" in the examples respectively indicate "part by mass" and "% by mass" unless otherwise specified.

Synthesis Example

<Component A: Synthesis of Polymer Compound Having Structure Represented by Formula 1>

[Synthesis of PA-1]

11.81 g of SA-1 (4,4'-diamino-3,3'-dihydroxybiphenyl (manufactured by Tokyo Chemical Industry Co., Ltd.), 0.0546 g of ortho-aminophenol (manufactured by Tokyo Chemical Industry Co., Ltd.), and 83.15 g of N,N-dimethylacetamide (manufactured by Kanto Chemical Co., Inc.) were weighed in a three-neck flask provided with a condenser and a stirrer, and the temperature of the reaction solution was set to room temperature (in a range of 10° C. to 30° C., the same applies hereinafter) to obtain a uniform solution. Next, 10.15 g of isophthaloyl dichloride (manufactured by Tokyo Chemical Industry Co., Ltd.) was dissolved in 32.68 g of N,N-dimethylacetamide (manufactured by Kanto Chemical Co., Inc.), the mixed solution was added dropwise to the uniform solution at room temperature for 30 minutes using a dropping funnel, and the obtained solution was stirred at room temperature for 30 minutes to cause a reaction. The reaction solution was poured to a mixed solution of 500 mL of pure water and 500 mL of acetone to precipitate the polymer. The polymer was filtered, washed, and dried, thereby obtaining 18.9 g of a binder polymer (PA-1) having a weight-average molecular weight of 45000.

It was confirmed whether the polymer was a target object using an NMR spectrum, an IR spectrum, and GPC (polystyrene conversion). In the same manner, PA-1 to PA-35 can be synthesized.

Further, the structure of PA-1 is as follows.

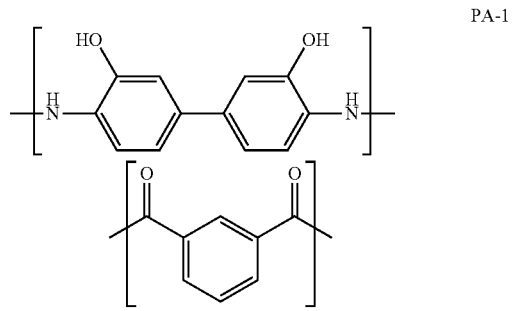

In the examples, the "weight-average molecular weight" was calculated according to a standard polystyrene conversion method using gel permeation chromatography (GPC). Here, a column filled with a polystyrene crosslinked gel (TSKgel SuperAWM-H; manufactured by Tosoh Corporation) was used as the GPC column, and N-methylpyrrolidone (0.01 mol/L of each of phosphoric acid and lithium bromide) was used as the GPC solvent.

Examples 1 to 20 and Comparative Examples 1 to 3

<Preparation of Support>

An aluminum alloy plate having a thickness of 0.3 mm of a material 1S was subjected to any treatment from among the following treatments A to F, thereby produced a support for a planographic printing plate. Moreover, during all treatment steps, a washing treatment with water was performed, and liquid cutting was performed using a nip roller after the washing treatment with water.

[Treatment A]

(A-a) Mechanical Roughening Treatment (Brush Grain Method)

While supplying a suspension of pumice (specific gravity of 1.1 g/cm$^3$) to the surface of an aluminum plate as a polishing slurry liquid, a mechanical roughening treatment was performed using rotating bundle bristle brushes.

The median diameter (μm) of a polishing material was set to 30 μm, the number of the brushes was set to four, and the rotation speed (rpm) of the brushes was set to 250 rpm. The material of the bundle bristle brushes was 6,10-nylon, the diameter of the brush bristles was 0.3 mm, and the bristle length was 50 mm. The brushes were produced by implanting bristles densely into the holes in a stainless steel cylinder having φ300 mm. The distance between two supporting rollers (φ200 mm) of the lower portion of the bundle bristle brush was 300 mm. The bundle bristle brushes were pressed until the load of a driving motor for rotating the brushes became 10 kW plus with respect to the load before the bundle bristle brushes were pressed against the aluminum plate. The rotation direction of the brushes was the same as the moving direction of the aluminum plate.

(A-b) Alkali Etching Treatment

The aluminum plate obtained above was subjected to an etching treatment by spraying a caustic soda aqueous solution in which the concentration of caustic soda was 26% by mass and the concentration of aluminum ions was 6.5% by mass using a spray tube at a temperature of 70° C. Thereafter, washing with water by spraying was performed. The amount of aluminum dissolved was 10 g/m$^2$.

(A-c) Desmutting Treatment in Acidic Aqueous Solution

Next, a desmutting treatment was performed in a nitric acid aqueous solution. As the nitric acid aqueous solution used in the desmutting treatment, the waste liquid of nitric acid used in electrochemical roughening of the next step was used. The temperature was 35° C. The desmutting treatment was performed for 3 seconds by spraying the desmutting liquid using a spray.

(A-d) Electrochemical Roughening Treatment

An electrochemical surface roughening treatment was continuously performed using an AC voltage of nitric acid electrolysis 60 Hz. As the electrolyte at this time, an electrolyte which had been adjusted to have a concentration of aluminum ions of 4.5 g/L by adding aluminum nitrate to a nitric acid aqueous solution having a concentration of 10.4 g/L at a temperature of 35° C. was used. Using a trapezoidal rectangular waveform AC having a time tp until the current value reached a peak from zero of 0.8 msec and the duty ratio of 1:1 as the AC power supply waveform, the electrochemical surface-roughening treatment was performed using a carbon electrode as a counter electrode. As an auxiliary anode, ferrite was used. The current density was 30 A/dm$^2$ as the peak current value, and 5% of the current from the power source was separately flowed to the auxiliary anode. The electric quantity (C/dm$^2$) was 185 C/dm$^2$ as the sum total of electric quantity at the time of anodization of the aluminum plate. Thereafter, washing with water by spraying was performed.

(A-e) Alkali Etching Treatment

The aluminum plate obtained above was subjected to an etching treatment by spraying a caustic soda aqueous solution in which the concentration of caustic soda was 5% by mass and the concentration of aluminum ions was 0.5% by mass using a spray tube at a temperature of 50° C. Thereafter, washing with water by spraying was performed. The amount of aluminum dissolved was 0.5 g/m$^2$.

(A-f) Desmutting Treatment in Acidic Aqueous Solution

Next, a desmutting treatment was performed in a sulfuric acid aqueous solution. As the sulfuric acid aqueous solution used in the desmutting treatment, a solution in which the concentration of sulfuric acid was 170 g/L and the concentration of aluminum ions was 5 g/L was used. The temperature was 30° C. The desmutting treatment was performed for 3 seconds by spraying the desmutting liquid using a spray.

(A-g) Electrochemical Roughening Treatment

An electrochemical surface roughening treatment was continuously performed using an AC voltage of hydrochloric acid electrolysis 60 Hz. As the electrolyte, an electrolyte which had been adjusted to have a concentration of aluminum ions of 4.5 g/L by adding aluminum nitrate to a hydrochloric acid aqueous solution having a concentration of 6.2 g/L at a liquid temperature of 35° C. was used. Using a trapezoidal rectangular waveform AC having a time tp until the current value reached a peak from zero of 0.8 msec and the duty ratio of 1:1, the electrochemical surface-roughening treatment was performed using a carbon electrode as a counter electrode. As an auxiliary anode, ferrite was used.

The current density was 25 A/dm$^2$ as the peak current value, and the electric quantity (C/dm$^2$) in the hydrochloric acid electrolysis was 63 C/dm$^2$ as the sum total of electric quantity at the time of anodization of the aluminum plate. Thereafter, washing with water by spraying was performed.

(A-h) Alkali Etching Treatment

The aluminum plate obtained above was subjected to an etching treatment by spraying a caustic soda aqueous solution in which the concentration of caustic soda was 5% by mass and the concentration of aluminum ions was 0.5% by mass using a spray tube at a temperature of 50° C. Thereafter, washing with water by spraying was performed. The amount of aluminum dissolved was 0.1 g/m$^2$.

(A-i) Desmutting Treatment in Acidic Aqueous Solution

Next, a desmutting treatment was performed in a sulfuric acid aqueous solution. Specifically, the desmutting treatment was performed at a solution temperature of 35° C. for 4 seconds using the waste liquid (aluminum ions having a concentration of 5 g/L were dissolved in a sulfuric acid aqueous solution having a concentration of 170 g/L) generated in the anodization treatment step. The desmutting treatment was performed for 3 seconds by spraying the desmutting liquid using a spray.

(A-j) Anodization Treatment

An anodization treatment was performed using an anodization apparatus (the length of each of a first electrolytic portion and a second electrolytic portion was 6 m, the length of each of a first feeding portion and a second feeding portion was 3 m, and the length of each of a first feeding electrode and a second feeding electrode was 2.4 m) of a two-stage feeding electrolytic treatment method. As the electrolyte supplied to the first electrolytic portion and the second electrolytic portion, sulfuric acid was used. All electrolytes have a concentration of sulfuric acid of 50 g/L (including 0.5% by mass of aluminum ions) and were at a temperature of 20° C. Thereafter, washing with water by spraying was performed.

(A-k) Silicate Treatment

To ensure hydrophilicity of the non-image area, a silicate treatment was performed by dipping at 50° C. for 7 seconds using 2.5% by mass No. 3 sodium silicate aqueous solution. The amount of Si attached was 10 mg/m$^2$. Thereafter, washing with water by spraying was performed.

[Treatment B]

(B-a) Mechanical Roughening Treatment (Brush Grain Method)

While supplying a suspension of pumice (specific gravity of 1.1 g/cm$^3$) to the surface of an aluminum plate as a polishing slurry liquid, a mechanical roughening treatment was performed using rotating bundle bristle brushes.

The median diameter (μm) of a polishing material was 30 μm, the number of the brushes was four, and the rotation speed (rpm) of the brushes was set to 250 rpm. The material of the bundle bristle brushes was nylon 6,10, the diameter of the brush bristles was 0.3 mm, and the bristle length was 50 mm. The brushes were produced by implanting bristles densely into the holes in a stainless steel cylinder having ϕ300 mm. The distance between two supporting rollers (ϕ200 mm) of the lower portion of the bundle bristle brush was 300 mm. The bundle bristle brushes were pressed until the load of a driving motor for rotating the brushes became 10 kW plus with respect to the load before the bundle bristle brushes were pressed against the aluminum plate. The rotation direction of the brushes was the same as the moving direction of the aluminum plate.

(B-b) Alkali Etching Treatment

The aluminum plate obtained above was subjected to an etching treatment by spraying a caustic soda aqueous solution in which the concentration of caustic soda was 26% by mass and the concentration of aluminum ions was 6.5% by mass using a spray tube at a temperature of 70° C. Thereafter, washing with water by spraying was performed. The amount of aluminum dissolved was 10 g/m$^2$.

(B-c) Desmutting Treatment in Acidic Aqueous Solution

Next, a desmutting treatment was performed in a nitric acid aqueous solution. As the nitric acid aqueous solution used in the desmutting treatment, the waste liquid of nitric acid used in electrochemical roughening of the next step was used. The temperature was 35° C. The desmutting treatment was performed for 3 seconds by spraying the desmutting liquid using a spray.

(B-d) Electrochemical Roughening Treatment

An electrochemical surface roughening treatment was continuously performed using an AC voltage of nitric acid electrolysis 60 Hz. As the electrolyte at this time, an electrolyte which had been adjusted to have a concentration of aluminum ions of 4.5 g/L by adding aluminum nitrate to a nitric acid aqueous solution having a concentration of 10.4 g/L at a temperature of 35° C. was used. Using a trapezoidal rectangular waveform AC having a time tp until the current value reached a peak from zero of 0.8 msec and the duty ratio of 1:1 as the AC power supply waveform, the electrochemical surface-roughening treatment was performed using a carbon electrode as a counter electrode. As an auxiliary anode, ferrite was used. The current density was 30 A/dm$^2$ as the peak current value, and 5% of the current from the power source was separately flowed to the auxiliary anode. The electric quantity (C/dm$^2$) was 185 C/dm$^2$ as the sum total of electric quantity at the time of anodization of the aluminum plate. Thereafter, washing with water by spraying was performed.

(B-e) Alkali Etching Treatment

The aluminum plate obtained above was subjected to an etching treatment by spraying a caustic soda aqueous solution in which the concentration of caustic soda was 5% by mass and the concentration of aluminum ions was 0.5% by mass using a spray tube at a temperature of 50° C. Thereafter, washing with water by spraying was performed. The amount of aluminum dissolved was 0.5 g/m$^2$.

(B-f) Desmutting Treatment in Acidic Aqueous Solution

Next, a desmutting treatment was performed in a sulfuric acid aqueous solution. As the sulfuric acid aqueous solution used in the desmutting treatment, a solution in which the concentration of sulfuric acid was 170 g/L and the concentration of aluminum ions was 5 g/L was used. The temperature was 30° C. The desmutting treatment was performed for 3 seconds by spraying the desmutting liquid using a spray.

(B-g) Electrochemical Roughening Treatment

An electrochemical surface roughening treatment was continuously performed using an AC voltage of hydrochloric acid electrolysis 60 Hz. As the electrolyte, an electrolyte which had been adjusted to have a concentration of aluminum ions of 4.5 g/L by adding aluminum nitrate to a hydrochloric acid aqueous solution having a concentration of 6.2 g/L at a liquid temperature of 35° C. was used. Using a trapezoidal rectangular waveform AC having a time tp until the current value reached a peak from zero of 0.8 msec and the duty ratio of 1:1, the electrochemical surface-roughening treatment was performed using a carbon electrode as a counter electrode. As an auxiliary anode, ferrite was used.

The current density was 25 A/dm$^2$ as the peak current value, and the electric quantity (C/dm$^2$) in the hydrochloric acid electrolysis was 63 C/dm$^2$ as the sum total of electric quantity at the time of anodization of the aluminum plate. Thereafter, washing with water by spraying was performed.

(B-h) Alkali Etching Treatment

The aluminum plate obtained above was subjected to an etching treatment by spraying a caustic soda aqueous solution in which the concentration of caustic soda was 5% by mass and the concentration of aluminum ions was 0.5% by mass using a spray tube at a temperature of 50° C. Thereafter, washing with water by spraying was performed. The amount of aluminum dissolved was 0.1 g/m$^2$.

(B-i) Desmutting Treatment in Acidic Aqueous Solution

Next, a desmutting treatment was performed in a sulfuric acid aqueous solution. Specifically, the desmutting treatment was performed at a solution temperature of 35° C. for 4 seconds using the waste liquid (aluminum ions having a concentration of 5 g/L were dissolved in a sulfuric acid aqueous solution having a concentration of 170 g/L) generated in the anodization treatment step. The desmutting treatment was performed for 3 seconds by spraying the desmutting liquid using a spray.

(B-j) First Stage of Anodization Treatment

A first stage of the anodization treatment was performed using an anodizing apparatus by DC electrolysis. The anodization treatment was performed using a solution obtained by dissolving aluminum ions of 7 g/L in a sulfuric acid aqueous solution of 170 g/L as an electrolytic bath under the conditions of a liquid temperature of 43° C. and a current density of 30 A/dm$^2$. The depth of the micropores was 27 μm, and the obtained coating amount was 0.13 g/m$^2$.

(B-k) Pore-Widening Treatment

A pore-widening treatment was performed by immersing the aluminum plate subjected to the anodization treatment in a caustic soda aqueous solution in which the concentration of caustic soda was 5% by mass and the concentration of aluminum ions was 0.5% by mass at a temperature of 35° C. for 1 second. Thereafter, washing with water by spraying was performed.

(B-l) Second Stage of Anodization Treatment

A second stage of the anodizing treatment was performed using an anodizing apparatus by DC electrolysis.

The anodizing treatment was performed using a solution obtained by dissolving aluminum ions of 7 g/L in a sulfuric acid aqueous solution of 170 g/L as an electrolytic bath under the conditions of a liquid temperature of 55° C. and a current density of 20 A/dm$^2$. The obtained coating amount was 2.6 g/m$^2$.

(B-m) Silicate Treatment

To ensure hydrophilicity of the non-image area, a silicate treatment was performed by dipping at 50° C. for 7 seconds using 2.5% by mass No. 3 sodium silicate aqueous solution. The amount of Si attached was 10 mg/m$^2$. Thereafter, washing with water by spraying was performed.

[Treatment C]

(C-a) Alkali Etching Treatment

The aluminum plate was subjected to an etching treatment by spraying a caustic soda aqueous solution in which the concentration of caustic soda was 26% by mass and the concentration of aluminum ions was 6.5% by mass using a spray tube at a temperature of 70° C. Thereafter, washing with water by spraying was performed. The amount of aluminum dissolved on the surface to be subjected to an electrochemical roughening treatment was 1.0 g/m$^2$.

(C-b) Desmutting Treatment in Acidic Aqueous Solution (First Desmutting Treatment)

Next, a desmutting treatment was performed in an acidic aqueous solution. As the acidic aqueous solution used in the desmutting treatment, a sulfuric acid aqueous solution having a concentration of 150 g/L was used. The temperature was 30° C. The desmutting treatment was performed for 3 seconds by spraying the desmutting liquid using a spray. Thereafter, washing with water was performed.

(C-c) Electrochemical Roughening Treatment in Acidic Aqueous Solution

Next, an electrolytic surface-roughening treatment was performed using an electrolyte in which the concentration of hydrochloric acid was 14 g/L, the concentration of aluminum ions was 13 g/L, and the concentration of sulfuric acid was 3 g/L. The temperature of the electrolyte was 30° C. The concentration of aluminum ions was adjusted by adding aluminum chloride.

The waveform of AC was a sine wave in which the positive waveform and the negative waveform were symmetrical, the frequency was 50 Hz, the anode reaction time and the cathode reaction time at one period of AC was 1:1, and the current density was 75 A/dm$^2$ at the peak current value of AC waveform. In addition, the electric quantity was 450 C/dm$^2$ as the sum total of electric quantity which the aluminum plate taken in the anode reaction, and the electrolytic treatment was performed four times with an interval of 4 seconds by 125 C/dm$^2$. As the counter electrode of the aluminum plate, a carbon electrode was used. Thereafter, washing with water was performed.

(C-d) Alkali Etching Treatment

The aluminum plate after the electrochemical roughening treatment was subjected to an etching treatment by spraying a caustic soda aqueous solution in which the concentration of caustic soda was 5% by mass and the concentration of aluminum ions was 0.5% by mass using a spray tube at a temperature of 35° C. The amount of aluminum dissolved on the surface subjected to the electrochemical roughening treatment was 0.1 g/m$^2$. Thereafter, washing with water was performed.

(C-e) Desmutting Treatment in Acidic Aqueous Solution

Next, a desmutting treatment was performed in an acidic aqueous solution. As the acidic aqueous solution used in the desmutting treatment, the waste liquid (aluminum ions of 5.0 g/L were dissolved in a sulfuric acid aqueous solution of 170 g/L) generated in the anodization treatment step was used. The temperature was 30° C. The desmutting treatment was performed for 3 seconds by spraying the desmutting liquid using a spray.

(C-f) Anodization Treatment

An anodization treatment was performed using an anodization apparatus (the length of each of a first electrolytic portion and a second electrolytic portion was 6 m, the length of each of a first feeding portion and a second feeding portion was 3 m, and the length of each of a first feeding electrode and a second feeding electrode was 2.4 m) of a two-stage feeding electrolytic treatment method. As the electrolyte supplied to the first electrolytic portion and the second electrolytic portion, sulfuric acid was used. All electrolytes have a concentration of sulfuric acid of 50 g/L (including 0.5% by mass of aluminum ions) and were at a temperature of 20° C. Thereafter, washing with water by spraying was performed.

(C-g) Silicate Treatment

To ensure hydrophilicity of the non-image area, a silicate treatment was performed by dipping at 50° C. for 7 seconds using 2.5% by mass No. 3 sodium silicate aqueous solution. The amount of Si attached was 10 mg/m$^2$. Thereafter, washing with water by spraying was performed.

[Treatment D]

(D-a) Alkali Etching Treatment

The aluminum plate was subjected to an etching treatment by spraying a caustic soda aqueous solution in which the concentration of caustic soda was 26% by mass and the concentration of aluminum ions was 6.5% by mass using a spray tube at a temperature of 70° C. Thereafter, washing with water by spraying was performed. The amount of aluminum dissolved on the surface to be subjected to an electrochemical roughening treatment was 5 g/m$^2$.

(D-b) Desmutting Treatment in Acidic Aqueous Solution

Next, a desmutting treatment was performed in a nitric acid aqueous solution. As the nitric acid aqueous solution used in the desmutting treatment, the waste liquid of nitric acid used in electrochemical roughening of the next step was used. The temperature was 35° C. The desmutting treatment was performed for 3 seconds by spraying the desmutting liquid using a spray.

(D-c) Electrochemical Roughening Treatment

An electrochemical surface roughening treatment was continuously performed using an AC voltage of nitric acid electrolysis 60 Hz. As the electrolyte at this time, an electrolyte which had been adjusted to have a concentration of aluminum ions of 4.5 g/L by adding aluminum nitrate to a nitric acid aqueous solution having a concentration of 10.4 g/L at a temperature of 35° C. was used. Using a trapezoidal rectangular waveform AC having a time tp until the current value reached a peak from zero of 0.8 msec and the duty ratio of 1:1 as the AC power supply waveform, the electrochemical surface-roughening treatment was performed using a carbon electrode as a counter electrode. As an auxiliary anode, ferrite was used. The current density was 30 A/dm$^2$ as the peak current value, and 5% of the current from the power source was separately flowed to the auxiliary anode. The electric quantity (C/dm$^2$) was 250 C/dm$^2$ as the sum total of electric quantity at the time of anodization of the aluminum plate. Thereafter, washing with water by spraying was performed.

(D-d) Alkali Etching Treatment

The aluminum plate obtained above was subjected to an etching treatment by spraying a caustic soda aqueous solution in which the concentration of caustic soda was 5% by mass and the concentration of aluminum ions was 0.5% by mass using a spray tube at a temperature of 50° C. Thereafter, washing with water by spraying was performed. The amount of aluminum dissolved was 0.2 g/m$^2$.

(D-e) Desmutting Treatment in Acidic Aqueous Solution

Next, a desmutting treatment was performed in a sulfuric acid aqueous solution. As the sulfuric acid aqueous solution used in the desmutting treatment, a solution in which the concentration of sulfuric acid was 170 g/L and the concentration of aluminum ions was 5 g/L was used. The temperature was 30° C. The desmutting treatment was performed for 3 seconds by spraying the desmutting liquid using a spray.

(D-f) Electrochemical Roughening Treatment

An electrochemical surface roughening treatment was continuously performed using an AC voltage of hydrochloric acid electrolysis 60 Hz. As the electrolyte, an electrolyte which had been adjusted to have a concentration of aluminum ions of 4.5 g/L by adding aluminum nitrate to a hydrochloric acid aqueous solution having a concentration of 6.2 g/L at a liquid temperature of 35° C. was used. Using a trapezoidal rectangular waveform AC having a time tp until the current value reached a peak from zero of 0.8 msec and the duty ratio of 1:1 as the AC power supply waveform, the electrochemical surface-roughening treatment was performed using a carbon electrode as a counter electrode. As an auxiliary anode, ferrite was used. The current density was 25 A/dm$^2$ as the peak current value, and the electric quantity (C/dm$^2$) in the hydrochloric acid electrolysis was 63 C/dm$^2$ as the sum total of electric quantity at the time of anodization of the aluminum plate. Thereafter, washing with water by spraying was performed.

(D-g) Alkali Etching Treatment

The aluminum plate obtained above was subjected to an etching treatment by spraying a caustic soda aqueous solution in which the concentration of caustic soda was 5% by mass and the concentration of aluminum ions was 0.5% by mass using a spray tube at a temperature of 50° C. Thereafter, washing with water by spraying was performed. The amount of aluminum dissolved was 0.1 g/m².

(D-h) Desmutting Treatment in Acidic Aqueous Solution

Next, a desmutting treatment was performed in a sulfuric acid aqueous solution. Specifically, the desmutting treatment was performed at a solution temperature of 35° C. for 4 seconds using the waste liquid (aluminum ions having a concentration of 5 g/L were dissolved in a sulfuric acid aqueous solution having a concentration of 170 g/L) generated in the anodization treatment step. The desmutting treatment was performed for 3 seconds by spraying the desmutting liquid using a spray.

(D-i) Anodization Treatment

An anodization treatment was performed using an anodization apparatus (the length of each of a first electrolytic portion and a second electrolytic portion was 6 m, the length of each of a first feeding portion and a second feeding portion was 3 m, and the length of each of a first feeding electrode and a second feeding electrode was 2.4 m) of a two-stage feeding electrolytic treatment method. As the electrolyte supplied to the first electrolytic portion and the second electrolytic portion, sulfuric acid was used. All electrolytes have a concentration of sulfuric acid of 50 g/L (including 0.5% by mass of aluminum ions) and were at a temperature of 20° C. Thereafter, washing with water by spraying was performed.

(D-j) Silicate Treatment

To ensure hydrophilicity of the non-image area, a silicate treatment was performed by dipping at 50° C. for 7 seconds using 2.5% by mass No. 3 sodium silicate aqueous solution. The amount of Si attached was 10 mg/m². Thereafter, washing with water by spraying was performed.

[Treatment (E)]

(E-a) Alkali Etching Treatment

The aluminum plate was subjected to an etching treatment by spraying a caustic soda aqueous solution in which the concentration of caustic soda was 26% by mass and the concentration of aluminum ions was 6.5% by mass using a spray tube at a temperature of 70° C. Thereafter, washing with water by spraying was performed. The amount of aluminum dissolved on the surface to be subjected to an electrochemical roughening treatment was 5 g/m².

(E-b) Desmutting Treatment in Acidic Aqueous Solution

Next, a desmutting treatment was performed in a nitric acid aqueous solution. As the nitric acid aqueous solution used in the desmutting treatment, the waste liquid of nitric acid used in electrochemical roughening of the next step was used. The temperature was 35° C. The desmutting treatment was performed for 3 seconds by spraying the desmutting liquid using a spray.

(E-c) Electrochemical Roughening Treatment

An electrochemical surface roughening treatment was continuously performed using an AC voltage of nitric acid electrolysis 60 Hz. As the electrolyte at this time, an electrolyte which had been adjusted to have a concentration of aluminum ions of 4.5 g/L by adding aluminum nitrate to a nitric acid aqueous solution having a concentration of 10.4 g/L at a temperature of 35° C. was used. Using a trapezoidal rectangular waveform AC having a time tp until the current value reached a peak from zero of 0.8 msec and the duty ratio of 1:1 as the AC power supply waveform, the electrochemical surface-roughening treatment was performed using a carbon electrode as a counter electrode. As an auxiliary anode, ferrite was used. The current density was 30 A/dm² as the peak current value, and 5% of the current from the power source was separately flowed to the auxiliary anode. The electric quantity (C/dm²) was 250 C/dm² as the sum total of electric quantity at the time of anodization of the aluminum plate. Thereafter, washing with water by spraying was performed.

(E-d) Alkali Etching Treatment

The aluminum plate obtained above was subjected to an etching treatment by spraying a caustic soda aqueous solution in which the concentration of caustic soda was 5% by mass and the concentration of aluminum ions was 0.5% by mass using a spray tube at a temperature of 50° C. Thereafter, washing with water by spraying was performed. The amount of aluminum dissolved was 0.2 g/m².

(E-e) Desmutting Treatment in Acidic Aqueous Solution

Next, a desmutting treatment was performed in a sulfuric acid aqueous solution. As the sulfuric acid aqueous solution used in the desmutting treatment, a solution in which the concentration of sulfuric acid was 170 g/L and the concentration of aluminum ions was 5 g/L was used. The temperature was 30° C. The desmutting treatment was performed for 3 seconds by spraying the desmutting liquid using a spray.

(E-f) Electrochemical Roughening Treatment

An electrochemical surface roughening treatment was continuously performed using an AC voltage of hydrochloric acid electrolysis 60 Hz. As the electrolyte, an electrolyte which had been adjusted to have a concentration of aluminum ions of 4.5 g/L by adding aluminum nitrate to a hydrochloric acid aqueous solution having a concentration of 6.2 g/L at a liquid temperature of 35° C. was used. Using a trapezoidal rectangular waveform AC having a time tp until the current value reached a peak from zero of 0.8 msec and the duty ratio of 1:1 as the AC power supply waveform, the electrochemical surface-roughening treatment was performed using a carbon electrode as a counter electrode. As an auxiliary anode, ferrite was used. The current density was 25 A/dm² as the peak current value, and the electric quantity (C/dm²) in the hydrochloric acid electrolysis was 63 C/dm² as the sum total of electric quantity at the time of anodization of the aluminum plate. Thereafter, washing with water by spraying was performed.

(E-g) Alkali Etching Treatment

The aluminum plate obtained above was subjected to an etching treatment by spraying a caustic soda aqueous solution in which the concentration of caustic soda was 5% by mass and the concentration of aluminum ions was 0.5% by mass using a spray tube at a temperature of 50° C. Thereafter, washing with water by spraying was performed. The amount of aluminum dissolved was 0.1 g/m².

(E-h) Desmutting Treatment in Acidic Aqueous Solution

Next, a desmutting treatment was performed in a sulfuric acid aqueous solution. Specifically, the desmutting treatment was performed at a solution temperature of 35° C. for 4 seconds using the waste liquid (aluminum ions having a concentration of 5 g/L were dissolved in a sulfuric acid aqueous solution having a concentration of 170 g/L) generated in the anodization treatment step. The desmutting treatment was performed for 3 seconds by spraying the desmutting liquid using a spray.

(E-i) First Stage of Anodization Treatment

A first stage of the anodization treatment was performed using an anodizing apparatus by DC electrolysis.

The anodization treatment was performed using a solution obtained by dissolving aluminum ions of 7 g/L in a sulfuric acid aqueous solution of 170 g/L as an electrolytic bath under the conditions of a liquid temperature of 43° C. and a current density of 30 A/dm². The depth of the micropores was 27 μM, and the obtained coating amount was 0.13 g/m².

(E-j) Pore-Widening Treatment

A pore-widening treatment was performed by immersing the aluminum plate subjected to the anodization treatment in a caustic soda aqueous solution in which the concentration of caustic soda was 5% by mass and the concentration of aluminum ions was 0.5% by mass at a temperature of 35° C. for 1 second. Thereafter, washing with water by spraying was performed.

(E-k) Second Stage of Anodization Treatment

A second stage of the anodizing treatment was performed using an anodizing apparatus by DC electrolysis. The anodizing treatment was performed using a solution obtained by dissolving aluminum ions of 7 g/L in a sulfuric acid aqueous solution of 170 g/L as an electrolytic bath under the conditions of a liquid temperature of 40° C. and a current density of 20 A/dm$^2$. The obtained coating amount was 2.6 g/m$^2$.

(E-l) Silicate Treatment

To ensure hydrophilicity of the non-image area, a silicate treatment was performed by dipping at 50° C. for 7 seconds using 2.5% by mass No. 3 sodium silicate aqueous solution. The amount of Si attached was 10 mg/m$^2$. Thereafter, washing with water by spraying was performed.

[Treatment F]

(F-a) Alkali Etching Treatment

The aluminum plate was subjected to an etching treatment by spraying a caustic soda aqueous solution in which the concentration of caustic soda was 26% by mass and the concentration of aluminum ions was 6.5% by mass using a spray tube at a temperature of 70° C. Thereafter, washing with water by spraying was performed. The amount of aluminum dissolved on the surface to be subjected to an electrochemical roughening treatment was 5 g/m$^2$.

(F-b) Desmutting Treatment in Acidic Aqueous Solution

Next, a desmutting treatment was performed in a nitric acid aqueous solution. As the nitric acid aqueous solution used in the desmutting treatment, the waste liquid of nitric acid used in electrochemical roughening of the next step was used. The temperature was 35° C. The desmutting treatment was performed for 3 seconds by spraying the desmutting liquid using a spray.

(F-c) Electrochemical Roughening Treatment

An electrochemical surface roughening treatment was continuously performed using an AC voltage of nitric acid electrolysis 60 Hz. As the electrolyte at this time, an electrolyte which had been adjusted to have a concentration of aluminum ions of 4.5 g/L by adding aluminum nitrate to a nitric acid aqueous solution having a concentration of 10.4 g/L at a temperature of 35° C. was used. Using a trapezoidal rectangular waveform AC having a time tp until the current value reached a peak from zero of 0.8 msec and the duty ratio of 1:1 as the AC power supply waveform, the electrochemical surface-roughening treatment was performed using a carbon electrode as a counter electrode. As an auxiliary anode, ferrite was used. The current density was 30 A/dm$^2$ as the peak current value, and 5% of the current from the power source was separately flowed to the auxiliary anode. The electric quantity (C/dm$^2$) was 250 C/dm$^2$ as the sum total of electric quantity at the time of anodization of the aluminum plate. Thereafter, washing with water by spraying was performed.

(F-d) Alkali Etching Treatment

The aluminum plate obtained above was subjected to an etching treatment by spraying a caustic soda aqueous solution in which the concentration of caustic soda was 5% by mass and the concentration of aluminum ions was 0.5% by mass using a spray tube at a temperature of 50° C. Thereafter, washing with water by spraying was performed. The amount of aluminum dissolved was 0.2 g/m$^2$.

(F-e) Desmutting Treatment in Acidic Aqueous Solution

Next, the desmutting treatment was performed at a solution temperature of 35° C. for 4 seconds using the waste liquid (aluminum ions having a concentration of 5 g/L were dissolved in a sulfuric acid aqueous solution having a concentration of 170 g/L) generated in the anodization treatment step. The desmutting treatment was performed in a sulfuric acid aqueous solution. The desmutting treatment was performed for 3 seconds by spraying the desmutting liquid using a spray.

(F-f) Anodization Treatment

An anodization treatment was performed using an anodization apparatus (the length of each of a first electrolytic portion and a second electrolytic portion was 6 m, the length of each of a first feeding portion and a second feeding portion was 3 m, and the length of each of a first feeding electrode and a second feeding electrode was 2.4 m) of a two-stage feeding electrolytic treatment method. As the electrolyte supplied to the first electrolytic portion and the second electrolytic portion, sulfuric acid was used. All electrolytes have a concentration of sulfuric acid of 50 g/L (including 0.5% by mass of aluminum ions) and were at a temperature of 20° C. Thereafter, washing with water by spraying was performed.

(F-g) Silicate Treatment

To ensure hydrophilicity of the non-image area, a silicate treatment was performed by dipping at 50° C. for 7 seconds using 2.5% by mass No. 3 sodium silicate aqueous solution. The amount of Si attached was 10 mg/m$^2$. Thereafter, washing with water by spraying was performed.

<Formation of undercoat layer>

Each of the supports A to F prepared in the above-described manner was coated with an undercoat layer coating solution 1 shown below and dried at 80° C. for 15 seconds, and undercoat layers were provided, thereby obtaining supports A-1 to F-1. The coating amount after drying was 15 mg/m$^2$.

—Undercoat Layer Coating Solution 1—

Following copolymer having weight-average molecular weight of 28,000:0.3 parts
Methanol: 100 parts
Water: 1 part

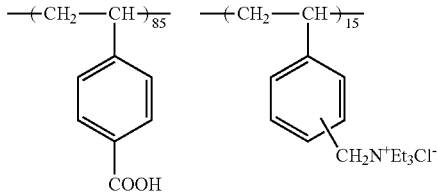

Et represents an ethyl group, and the numerical values at the lower right of parentheses are molar ratios.

<Formation of Image Recording Layer>

After each of the obtained supports A-1 to F-1 was coated with a coating solution composition (I) for forming a lower layer having the following composition using a wire bar such that the coating amount became 1.0 g/m$^2$, each resulting support was dried in a drying oven at 150° C. for 40 seconds, whereby lower layers were provided. After the lower layers were provided, each of the supports was coated with a coating solution composition (II) for forming an upper layer having the following composition using a wire bar, whereby upper layers were provided. After application, the resulting products were dried at 150° C. for 40 seconds, thereby obtaining planographic printing plate precursors respectively having a total coating amount of the lower layer and the upper layer of 1.2 g/m².

—Coating Solution Composition (I) for Forming Lower Layer—

Specific polymer compound (component A) described in Table 2: 3.5 parts
m,p-Cresol novolac (m/p ratio=6/4, weight-average molecular weight of 6,000): 0.6 parts
Infrared absorbent (IR coloring agent (1): following structure): 0.2 parts
4,4'-Bishydroxyphenyl sulfone: 0.3 parts
Tetrahydrophthalic acid: 0.4 parts
p-Toluenesulfonic acid: 0.02 parts
3-Methoxy-4-diazodiphenylamine hexafluorophosphate: 0.06 parts
Product obtained by replacing counter ion of ethyl violet with 6-hydroxynaphthalenesulfonic acid: 0.15 parts
Fluorine-based surfactant (MEGAFAC F-780, manufactured by DIC Corporation): 0.07 parts
Methyl ethyl ketone: 30 parts
1-Methoxy-2-butyrolactone: 15 parts
γ-Butyrolactone: 15 parts IR coloring agent (1)

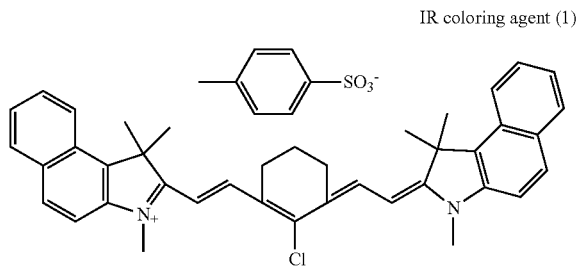

—Coating Solution Composition (II) for Forming Upper Layer—

Novolac resin (m-cresol/p-cresol/phenol=3/2/5, Mw 8,000): 0.68 parts
Infrared absorbent (IR coloring agent (1): structure shown above): 0.045 parts
Fluorine-based surfactant (MEGAFAC F-780, manufactured by DIC Corporation): 0.03 parts
Methyl ethyl ketone: 15.0 parts
1-Methoxy-2-propanol: 30.0 parts
5-Benzoyl-4-hydroxy-2-methoxybenzenesulfonate of 1-(4-methylbenzyl)-1-phenylpiperidinium: 0.01 parts The following evaluations were performed on the obtained planographic printing plate precursors, and the results are listed in Table 2.

<Evaluation of Non-Image Area Development Time>

Drawing of a test pattern in an image shape was performed on each planographic printing plate precursor by changing the exposure energy using a Trendsetter VX manufactured by Creo company. Thereafter, the resulting product was immersed in a developing bath charged with a developer XP-D (diluted and made to have a conductivity of 43 mS/cm, manufactured by Fujifilm Corporation), and the time required for developing the non-image area at a developing temperature of 30° C. was measured. The immersion time at which the image density became equal to the image density of the Al support was set as a non-image area development time. A development time which was shorter than 20 seconds was evaluated as 1; a development time which was longer than or equal to 20 seconds and shorter than 60 seconds was evaluated as 2; a development time which was longer than or equal to 60 seconds and shorter than 150 seconds was evaluated as 3; and a development time which was longer than or equal to 150 seconds was evaluated as 4. As the non-image area development time was shorter, the solubility of the non-image area in an alkali aqueous solution was excellent and the alkali aqueous solution developability (highlight reproducibility) was excellent. The results are shown in Table 2.

<Evaluation of Non-Burning Printing Durability>

Drawing of a test pattern in an image shape was performed on each planographic printing plate precursor using a Trendsetter VX (manufactured by Creo company) at a beam intensity of 9 W and a drum rotation speed of 150 rpm. Thereafter, using PS PROCESSOR LP940H (manufactured by Fujifilm Corporation) charged with a developer XP-D (diluted and made to have a conductivity of 43 mS/cm, manufactured by Fujifilm Corporation), development was performed at a developing temperature of 30° C. and the development time was set such that the development time was set to 20 seconds in a case where the development time for the non-image area was evaluated as "1", the development time was set to 60 seconds in a case where the evaluation of the development time for the non-image area was evaluated as "2", the development time was set to 150 seconds in a case where the evaluation of the development time for the non-image area was evaluated as "3", and the development time was set to 200 seconds in a case where the evaluation of the development time for the non-image area was evaluated as "4". This was continuously printed using a printer Lithrone (manufactured by KOMORI Corporation). As the ink, a tokunen black ink (manufactured by TOYO INK CO., LTD.) which contains calcium carbonate, as a model of a low-grade material was used. At this time, the printing durability was evaluated by visually observing how many sheets could be printed while maintaining a sufficient ink density. As the number of sheets was larger, the printing durability was evaluated to be excellent. The results are listed in Table 2.

<Evaluation of Burning Printing Durability>

Drawing of a test pattern in an image shape was performed on each planographic printing plate precursor using a Trendsetter VX (manufactured by Creo company) at a beam intensity of 9 W and a drum rotation speed of 150 rpm. Thereafter, using PS PROCESSOR LP940H (manufactured by Fujifilm Corporation) charged with a developer XP-D (diluted and made to have a conductivity of 43 mS/cm, manufactured by Fujifilm Corporation), development was performed at a developing temperature of 30° C. and the development time was set such that the development time was set to 20 seconds in a case where the development time for the non-image area was evaluated as "1", the development time was set to 60 seconds in a case where the evaluation of the development time for the non-image area was evaluated as "2", the development time was set to 150 seconds in a case where the evaluation of the development time for the non-image area was evaluated as "3", and the development time was set to 200 seconds in a case where the evaluation of the development time for the non-image area was evaluated as "4". The resultant was heated in an oven at 260° C. for 6 minutes. This was continuously printed using a printer Lithrone (manufactured by KOMORI Corporation). As the ink, a tokunen black ink (manufactured by TOYO INK CO., LTD.) which contains calcium carbonate, as a model of a low-grade material was used. At this time, the burning printing durability was evaluated by visually observing how many sheets could be printed while maintaining a sufficient ink density. The printing durability at this time was compared to the non-burning printing durability, and the printing durability which was improved by 150% or greater was evaluated as 1, the printing durability which was improved by greater than or equal to 130% and less than 150% was evaluated as 2, the printing durability which was improved by greater than or equal to 110% and less than 130% was evaluated as 3, and the printing durability which was improved by less than 110% was evaluated as 4. As the improvement rate was higher than that of the non-burning durability, the burning printing durability was evaluated to be excellent. The results are listed in Table 2.

<Evaluation of Chemical Resistance>

Exposure, development, and printing were performed on the planographic printing plate precursors in the same manner as in the evaluation of the printing durability. At this time, every time 5,000 sheets were printed, a step of wiping the plate surface with a cleaner (MC-E, manufactured by Fujifilm Corporation, multi cleaner) was performed, and the chemical resistance was evaluated. The printing durability at this time was evaluated as 1 in a case where the printing durability was 95% to 100% of the number of printing endurable sheets described above, evaluated as 2 in a case where the printing durability was greater than or equal to 80% and less than 95% of the number of printing endurable sheets described above, evaluated as 3 in a case where the printing durability was greater than or equal to 60% and less than 80% of the number of printing endurable sheets described above, and evaluated as 4 in a case where the printing durability was less than 60% of the number of printing endurable sheets described above. Even in a case where the step of wiping the plate surface with a cleaner was performed, the chemical resistance was evaluated to be excellent as the change in the printing durability index was smaller. The results are listed in Table 2.

As evident from the results listed in Table 2, it was understood that the developability and the printing durability were improved in a case where the photosensitive resin composition of the present disclosure was used.

Further, CP-1 to CP-3 listed in Table 2 were synthesized according to the following method.

Synthesis Example of Comparative Example 1
(CP-1)

9.91 g of 4,4'-diaminodiphenylmethane (manufactured by Tokyo Chemical Industry Co., Ltd.), 0.0423 g of aniline (manufactured by Tokyo Chemical Industry Co., Ltd.), and 79.59 g of N,N-dimethylacetamide (manufactured by Kanto Chemical Co., Inc.) were weighed in a three-neck flask provided with a condenser and a stirrer, and the temperature of the reaction solution was set to room temperature to obtain a uniform solution. Next, 10.15 g of isophthaloyl dichloride (manufactured by Tokyo Chemical Industry Co., Ltd.) was dissolved in 34.11 g of N,N-dimethylacetamide (manufactured by Kanto Chemical Co., Inc.), the mixed solution was added dropwise to the uniform solution at room temperature for 30 minutes using a dropping funnel, and the obtained solution was stirred at room temperature for 30 minutes to cause a reaction. The reaction solution was poured to a mixed solution of 500 mL of pure water and 500 mL of acetone to precipitate the polymer. The polymer was filtered, washed, and dried, thereby obtaining 17.8 g of a binder polymer (CP-1) having a weight-average molecular weight of 51000. It was confirmed whether the polymer was a target object using an NMR spectrum, an IR spectrum, and GPC (polystyrene conversion).

Synthesis Example of Comparative Example 2
(CP-2)

7.61 g of 3,5-diaminobenzoic acid (manufactured by Tokyo Chemical Industry Co., Ltd.), 0.0423 g of aniline

TABLE 2

| | Support | Component A | Development time for non-image area | Non-burning printing durability Number of printed sheets (ten thousand sheets) | Burning printing durability | Chemical resistance |
|---|---|---|---|---|---|---|
| Example 1 | A-1 | PA-1 | 1 | 12 | 1 | 1 |
| Example 2 | B-1 | PA-1 | 1 | 12 | 1 | 1 |
| Example 3 | C-1 | PA-1 | 1 | 12 | 1 | 1 |
| Example 4 | D-1 | PA-1 | 1 | 12 | 1 | 1 |
| Example 5 | E-1 | PA-1 | 1 | 12 | 1 | 1 |
| Example 6 | F-1 | PA-1 | 1 | 12 | 1 | 1 |
| Example 7 | A-1 | PA-2 | 1 | 11 | 1 | 1 |
| Example 8 | A-1 | PA-3 | 2 | 12 | 1 | 1 |
| Example 9 | A-1 | PA-4 | 2 | 12 | 1 | 1 |
| Example 10 | A-1 | PA-5 | 2 | 12 | 1 | 1 |
| Example 11 | A-1 | PA-7 | 1 | 11 | 1 | 1 |
| Example 12 | A-1 | PA-9 | 1 | 10 | 1 | 1 |
| Example 13 | A-1 | PA-11 | 1 | 9 | 1 | 2 |
| Example 14 | A-1 | PA-13 | 1 | 9 | 1 | 1 |
| Example 15 | A-1 | PA-16 | 1 | 9 | 1 | 2 |
| Example 16 | A-1 | PA-17 | 1 | 11 | 1 | 1 |
| Example 17 | A-1 | PA-19 | 2 | 10 | 1 | 2 |
| Example 18 | A-1 | PA-31 | 1 | 12 | 3 | 1 |
| Example 19 | A-1 | PA-32 | 1 | 12 | 3 | 1 |
| Example 20 | A-1 | PA-34 | 1 | 12 | 3 | 1 |
| Comparative Example 1 | A-1 | CP-1 | 4 | 6 | 3 | 2 |
| Comparative Example 2 | A-1 | CP-2 | 4 | 4 | 4 | 4 |
| Comparative Example 3 | A-1 | CP-3 | 1 | 3 | 3 | 1 |

(manufactured by Tokyo Chemical Industry Co., Ltd.), and 70.44 g of N,N-dimethylacetamide (manufactured by Kanto Chemical Co., Inc.) were weighed in a three-neck flask provided with a condenser and a stirrer, and the temperature of the reaction solution was set to room temperature to obtain a uniform solution. Next, 10.15 g of isophthaloyl dichloride (manufactured by Tokyo Chemical Industry Co., Ltd.) was dissolved in 30.19 g of N,N-dimethylacetamide (manufactured by Kanto Chemical Co., Inc.), the mixed solution was added dropwise to the uniform solution at room temperature for 30 minutes using a dropping funnel, and the obtained solution was stirred at room temperature for 30 minutes to cause a reaction. The reaction solution was poured to a mixed solution of 500 mL of pure water and 500 mL of acetone to precipitate the polymer. The polymer was filtered, washed, and dried, thereby obtaining 15.1 g of a binder polymer (CP-2) having a weight-average molecular weight of 49000. It was confirmed whether the polymer was a target object using an NMR spectrum, an IR spectrum, and GPC (polystyrene conversion).

Synthesis Example of Comparative Example 3 (CP-3)

5.80 g of N,N'-dimethylformamide (manufactured by Wako Pure Chemical Industries, Ltd.) was weighed in a three-neck flask provided with a condenser and a stirrer, and the solution was stirred at 65° C. for 30 minutes while flowing nitrogen. Next, 7.21 g of 4-methacrylamidebenzenesulfonamide (manufactured by FUJIFILM Finechemicals Co., Ltd.), 3.00 g of methyl methacrylate (manufactured by Wako Pure Chemical Industries, Ltd.), 2.12 g of acrylonitrile (manufactured by Tokyo Chemical Industry Co., Ltd.), 23.0 g of N,N'-dimethylformamide (manufactured by Wako Pure Chemical Industries, Ltd.), and 0.324 g of azobisisobutyronitrile (manufactured by Wako Pure Chemical Industries, Ltd.) were weighed using a dropping funnel, dissolved, and added dropwise to the flask for 2 hours. Further, the resulting solution was stirred at 65° C. for 3 hours. The reaction solution was added dropwise to a mixed solution of 0.5 L of pure water and 0.5 L of methanol to precipitate the polymer. The polymer was filtered, washed, and dried, thereby obtaining 11.2 g of a binder polymer (CP-3) having a weight-average molecular weight of 53000. It was confirmed whether the polymer was a target object using an NMR spectrum, an IR spectrum, and GPC (polystyrene conversion).

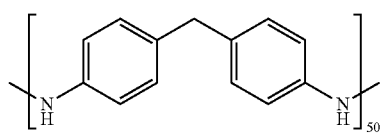

CP-1

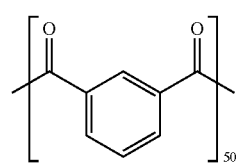

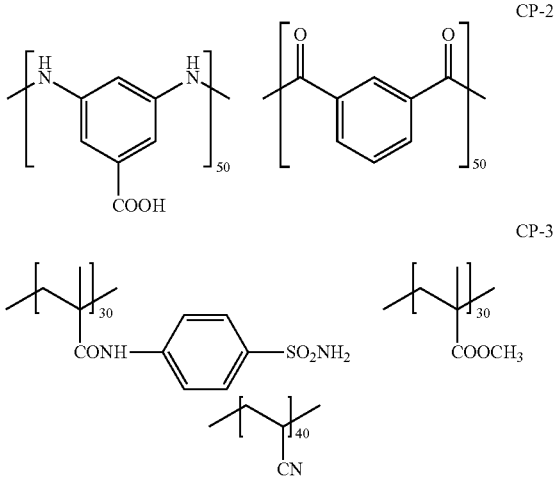

Further, the numerical values at the lower right of parentheses in CP-1 to CP-3 are molar ratios.

Examples 21 to 40 and Comparative Examples 4 to 6

<Preparation of Support>
Supports A to F were prepared in the same manners as in Examples 1 to 20.
<Formation of Undercoat Layer>
Supports A-1 to F-1 respectively having an undercoat layer were prepared in the same manners as in Examples 1 to 20.
<Formation of Recording Layer>
After each of the obtained supports A-1 to F-1 was coated with a coating solution composition (III) for forming a lower layer having the following composition using a wire bar such that the coating amount became 1.0 g/m², each resulting support was dried in a drying oven at 150° C. for 40 seconds, whereby lower layers were provided. After the lower layers were provided, each of the supports was coated with a coating solution composition (IV) for forming an upper layer having the following composition using a wire bar, whereby upper layers were provided. After application, the resulting products were dried at 150° C. for 40 seconds, thereby obtaining planographic printing plate precursors respectively having a total coating amount of the lower layer and the upper layer of 1.2 g/m².
—Coating Solution Composition (III) for Forming Lower Layer—
  Copolymer (weight-average molecular weight of 65000) containing N-(p-aminosulfonylphenyl)methacrylamide, methyl methacrylate, and acrylonitrile at molar ratio of 35:35:30: 3.5 parts
  m,p-Cresol novolac (m/p ratio=6/4, weight-average molecular weight of 6,000): 0.6 parts
  Infrared absorbent (IR coloring agent (1) shown above): 0.2 parts
  4,4'-Bishydroxyphenyl sulfone: 0.3 parts
  Tetrahydrophthalic acid: 0.4 parts
  p-Toluenesulfonic acid: 0.02 parts
  3-Methoxy-4-diazodiphenylamine hexafluorophosphate: 0.06 parts
  Product obtained by replacing counter ion of ethyl violet with 6-hydroxynaphthalenesulfonic acid: 0.15 parts Fluorine-based surfactant (MEGAFAC F-780, manufactured by DIC Corporation): 0.07 parts
Methyl ethyl ketone: 30 parts
1-Methoxy-2-butyrolactone: 15 parts
γ-Butyrolactone: 15 parts
—Coating Solution Composition (IV) for Forming Upper Layer—
  Specific polymer compound (component A) listed in Table 3: 0.3 parts
  Novolac resin (m-cresol/p-cresol/phenol=3/2/5, Mw 8,000): 0.4 parts
  Infrared absorbent (IR coloring agent (1)): 0.045 parts
  Fluorine-based surfactant (MEGAFAC F-780, manufactured by DIC Corporation): 0.03 parts
  Methyl ethyl ketone: 15.0 parts
  1-Methoxy-2-propanol: 30.0 parts
  5-Benzoyl-4-hydroxy-2-methoxybenzenesulfonate of 1-(4-methylbenzyl)-1-phenylpiperidinium: 0.01 parts The results obtained by performing evaluations on each of the obtained planographic printing plate precursors under the same conditions as those in Example 1 are listed in Table 3.

TABLE 3

|  | Support | Component A | Development time for non-image area | Non-burning printing durability Number of printed sheets (ten thousand sheets) | Burning printing durability | Chemical resistance |
|---|---|---|---|---|---|---|
| Example 21 | A-1 | PA-1 | 1 | 11 | 1 | 1 |
| Example 22 | B-1 | PA-1 | 1 | 11 | 1 | 1 |
| Example 23 | C-1 | PA-1 | 1 | 11 | 1 | 1 |
| Example 24 | D-1 | PA-1 | 1 | 11 | 1 | 1 |
| Example 25 | E-1 | PA-1 | 1 | 11 | 1 | 1 |
| Example 26 | F-1 | PA-1 | 1 | 11 | 1 | 1 |
| Example 27 | A-1 | PA-2 | 1 | 10 | 1 | 1 |
| Example 28 | A-1 | PA-3 | 2 | 11 | 1 | 1 |
| Example 29 | A-1 | PA-4 | 2 | 11 | 1 | 1 |
| Example 30 | A-1 | PA-5 | 2 | 11 | 1 | 1 |
| Example 31 | A-1 | PA-7 | 1 | 12 | 1 | 1 |
| Example 32 | A-1 | PA-9 | 1 | 9 | 1 | 1 |
| Example 33 | A-1 | PA-11 | 1 | 8 | 1 | 1 |
| Example 34 | A-1 | PA-13 | 1 | 8 | 1 | 1 |
| Example 35 | A-1 | PA-16 | 1 | 8 | 1 | 2 |
| Example 36 | A-1 | PA-17 | 1 | 10 | 1 | 2 |
| Example 37 | A-1 | PA-19 | 2 | 9 | 1 | 2 |
| Example 38 | A-1 | PA-31 | 1 | 11 | 3 | 1 |
| Example 39 | A-1 | PA-32 | 1 | 11 | 3 | 1 |
| Example 40 | A-1 | PA-34 | 1 | 11 | 3 | 1 |
| Comparative Example 4 | A-1 | CP-1 | 4 | 5 | 3 | 2 |
| Comparative Example 5 | A-1 | CP-2 | 4 | 3 | 4 | 4 |
| Comparative Example 6 | A-1 | CP-3 | 1 | 2.5 | 3 | 1 |

As evident from the results listed in Table 3, it was understood that all of the chemical resistance, the developability, and the printing durability were excellent in a case where the photosensitive resin composition of the present disclosure was used.

Examples 41 to 60 and Comparative Examples 7 to 9

<Preparation of Support>
Supports A to F were prepared in the same manners as in Examples 1 to 20.
<Formation of Undercoat Layer>
Each of the supports A to F prepared in the above-described manner was coated with an undercoat layer coating solution 2 shown below and dried at 80° C. for 15 seconds, and undercoat layers were provided, thereby obtaining supports A-2 to F-2. The coating amount after drying was 15 mg/m².
—Undercoat Layer Coating Solution 2—
  β-alanine: 0.5 parts
  Methanol: 95 parts
  Water: 5 parts
<Formation of Recording Layer>
After each of the obtained supports A-2 to F-2 was coated with a coating solution composition (V) for forming a lower layer having the following composition using a wire bar such that the coating amount became 1.5 g/m², each resulting support was dried in a drying oven at 160° C. for 40 seconds and immediately cooled to 35° C. using cold air in a temperature range of 17° C. to 20° C., whereby lower layers were provided. After the lower layers were provided, each of the supports was coated with a coating solution composition (VI) for forming an upper layer having the following composition using a wire bar such that the coating amount became 0.5 g/m², dried at 130° C. for 40 seconds, and slowly cooled using air in a temperature range of 20° C. to 26° C. to obtain upper layers, thereby obtaining planographic printing plate precursors.
—Coating Solution Composition (V) for Forming Lower Layer—
  Specific polymer compound (component A) described in Table 4: 0.8 parts
  Infrared absorbent (IR coloring agent (1): structure shown above): 0.017 parts
  Crystal Violet (manufactured by HODOGAYA CHEMICAL CO., LTD.): 0.017 parts
  MEGAFAC F-177 (manufactured by DIC Corporation, fluorine-based surfactant): 0.015 parts
  γ-Butyrolactone: 10 parts
  Methyl ethyl ketone: 10 parts
  1-Methoxy-2-propanol: 8 parts —Coating Solution Composition (VI) for Forming Upper Layer—

Styrene/acrylonitrile/methacrylic acid copolymers (compositional ratio of 69 mol %/25 mol %/6 mol %, weight-average molecular weight=45,000):20 parts
Alkali-soluble resin: following polyurethane 1:10 parts
Ethyl Violet: 0.03 parts
MEGAFAC F-177 (manufactured by DIC Corporation, fluorine-based surfactant): 0.05 parts
3-Pentanone: 60 parts
Propylene glycol monomethyl ether-2-acetate: 8 parts <<Synthesis of Polyurethane 1>>

A diisocyanate compound and a diol compound represented by the following formulae were polymerized at a molar ratio of 1:1 (weight-average molecular weight of 36,000).

ditions as those in Example 1 except that the following specific developer A shown below was used during the development treatment. The results are listed in Table 4.

—Composition of Specific Developer A—

Water: 796 parts
Sodium carbonate: 12.8 parts
Sodium bicarbonate: 7.0 parts
Sodium gluconate: 15.5 parts
SOFTAZOLINOE LPB-R (30% aqueous solution, manufactured by Kawaken Fine Chemicals Co., Ltd.): 154.0 parts
SOFTAZOLINE LAO (30% aqueous solution, manufactured by Kawaken Fine Chemicals Co., Ltd.): 38.0 parts
Ethylenediamine disuccinate: 6.7 parts
The pH of the specific developer A was 9.85.

TABLE 4

| | Support | Component A | Development time for non-image area | Non-burning printing durability Number of printed sheets (ten thousand sheets) | Burning printing durability | Chemical resistance |
|---|---|---|---|---|---|---|
| Example 41 | A-1 | PA-1 | 1 | 14 | 1 | 1 |
| Example 42 | B-1 | PA-1 | 1 | 14 | 1 | 1 |
| Example 43 | C-1 | PA-1 | 1 | 14 | 1 | 1 |
| Example 44 | D-1 | PA-1 | 1 | 14 | 1 | 1 |
| Example 45 | E-1 | PA-1 | 1 | 14 | 1 | 1 |
| Example 46 | F-1 | PA-1 | 1 | 14 | 1 | 1 |
| Example 47 | A-1 | PA-2 | 1 | 13 | 1 | 1 |
| Example 48 | A-1 | PA-3 | 2 | 13 | 1 | 1 |
| Example 49 | A-1 | PA-4 | 2 | 13 | 1 | 1 |
| Example 50 | A-1 | PA-5 | 2 | 14 | 1 | 1 |
| Example 51 | A-1 | PA-7 | 1 | 14 | 1 | 1 |
| Example 52 | A-1 | PA-9 | 1 | 11 | 1 | 1 |
| Example 53 | A-1 | PA-11 | 1 | 11 | 1 | 1 |
| Example 54 | A-1 | PA-13 | 1 | 11 | 1 | 1 |
| Example 55 | A-1 | PA-16 | 1 | 12 | 1 | 2 |
| Example 56 | A-1 | PA-17 | 1 | 10 | 1 | 2 |
| Example 57 | A-1 | PA-19 | 2 | 10 | 1 | 2 |
| Example 58 | A-1 | PA-31 | 1 | 14 | 3 | 1 |
| Example 59 | A-1 | PA-32 | 1 | 14 | 3 | 1 |
| Example 60 | A-1 | PA-34 | 1 | 14 | 3 | 1 |
| Comparative Example 7 | A-1 | CP-1 | 4 | 8 | 3 | 2 |
| Comparative Example 8 | A-1 | CP-2 | 4 | 6 | 4 | 4 |
| Comparative Example 9 | A-1 | CP-3 | 1 | 4 | 3 | 1 |

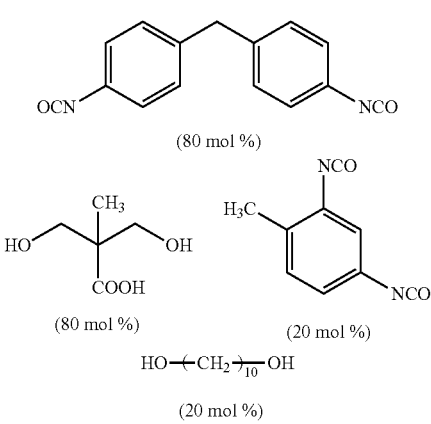

Evaluations were performed on each of the obtained planographic printing plate precursors under the same con- As evident from the results listed in Table 4, it was understood that all of the chemical resistance, the developability, and the printing durability were excellent in a case where the photosensitive resin composition of the present disclosure was used.

Examples 61 to 80 and Comparative Examples 10 to 12

<Preparation of Support>

Supports A to F were prepared in the same manners as in Examples 1 to 20.

<Formation of Undercoat Layer>

Each of the supports A-1 to F-1 respectively having an undercoat layer were prepared in the same manners as those in Examples 1 to 20.

<Formation of Recording Layer>

After each of the obtained supports A-1 to F-1 was coated with a coating solution composition (VII) for forming a lower layer having the following composition using a wire bar such that the coating amount became 1.5 g/m², each resulting support was dried in a drying oven at 160° C. for 40 seconds and immediately cooled to 35° C. using cold air in a temperature range of 17° C. to 20° C., whereby lower layers were provided. After the lower layers were provided, each of the supports was coated with a coating solution 3-Pentanone: 60 parts
Propylene glycol monomethyl ether-2-acetate: 8 parts The results obtained by performing evaluations on each of the obtained planographic printing plate precursors under the same conditions as those for Example 1 are listed in Table 5.

TABLE 5

|  | Support | Component A | Development time for non-image area | Non-burning printing durability Number of printed sheets (ten thousand sheets) | Burning printing durability | Chemical resistance |
| --- | --- | --- | --- | --- | --- | --- |
| Example 61 | A-1 | PA-1 | 1 | 12 | 1 | 1 |
| Example 62 | B-1 | PA-1 | 1 | 12 | 1 | 1 |
| Example 63 | C-1 | PA-1 | 1 | 12 | 1 | 1 |
| Example 64 | D-1 | PA-1 | 1 | 12 | 1 | 1 |
| Example 65 | E-1 | PA-1 | 1 | 12 | 1 | 1 |
| Example 66 | F-1 | PA-1 | 1 | 12 | 1 | 1 |
| Example 67 | A-1 | PA-2 | 1 | 11 | 1 | 1 |
| Example 68 | A-1 | PA-3 | 2 | 12 | 1 | 1 |
| Example 69 | A-1 | PA-4 | 2 | 12 | 1 | 1 |
| Example 70 | A-1 | PA-5 | 2 | 12 | 1 | 1 |
| Example 71 | A-1 | PA-7 | 1 | 11 | 1 | 1 |
| Example 72 | A-1 | PA-9 | 1 | 10 | 1 | 1 |
| Example 73 | A-1 | PA-11 | 1 | 9 | 1 | 1 |
| Example 74 | A-1 | PA-13 | 1 | 9 | 1 | 1 |
| Example 75 | A-1 | PA-16 | 1 | 9 | 1 | 2 |
| Example 76 | A-1 | PA-17 | 1 | 11 | 1 | 2 |
| Example 77 | A-1 | PA-19 | 2 | 10 | 1 | 2 |
| Example 78 | A-1 | PA-31 | 1 | 12 | 3 | 1 |
| Example 79 | A-1 | PA-32 | 1 | 12 | 3 | 1 |
| Example 80 | A-1 | PA-34 | 1 | 12 | 3 | 1 |
| Comparative Example 10 | A-1 | CP-1 | 4 | 6 | 3 | 2 |
| Comparative Example 11 | A-1 | CP-2 | 4 | 4 | 4 | 4 |
| Comparative Example 12 | A-1 | CP-3 | 1 | 3 | 3 | 1 | composition (VIII) for forming an upper layer having the following composition using a wire bar such that the coating amount became 0.5 g/m², dried at 130° C. for 40 seconds, and slowly cooled using air in a temperature range of 20° C. to 26° C. to obtain upper layers, thereby obtaining planographic printing plate precursors.

—Coating Solution Composition (VII) for Forming Lower Layer—
  N-phenylmaleimide-methacrylic acid-methacrylamide copolymer (copolymerization ratio of 60 mol %/15 mol %/25 mol %, weight-average molecular weight of 50000): 0.8 parts
  Infrared absorbent (IR coloring agent (1): structure shown above): 0.017 parts
  Crystal Violet (manufactured by HODOGAYA CHEMICAL CO., LTD.): 0.017 parts
  MEGAFAC F-177 (manufactured by DIC Corporation, fluorine-based surfactant): 0.015 parts
  γ-Butyrolactone: 10 parts
  Methyl ethyl ketone: 10 parts
  1-Methoxy-2-propanol: 8 parts
—Coating Solution Composition (VIII) for Forming Upper Layer—
  Specific polymer compound (component A) listed in Table 5: 20 parts
  Alkali-soluble resin (polyurethane 1 shown above): 10 parts
  Ethyl Violet: 0.03 parts
  MEGAFAC F-177 (manufactured by DIC Corporation, fluorine-based surfactant): 0.05 parts As evident from the results listed in Table 5, it was understood that all of the chemical resistance, the developability, and the printing durability were excellent in a case where the photosensitive resin composition of the present disclosure was used.

Examples 81 to 100 and Comparative Examples 13 to 15)

<Preparation of Support>
Supports A to F were prepared in the same manners as in Examples 1 to 20.
<Formation of Undercoat Layer>
Supports A-1 to F-1 respectively having an undercoat layer were prepared in the same manners as those in Examples 1 to 20.
<Formation of Recording Layer>
After each of the obtained supports A-1 to F-1 was coated with a coating solution composition (IX) having the following composition using a wire bar, each resulting support was dried in a drying oven at 140° C. for 50 seconds, thereby obtaining planographic printing plate precursors respectively having a coating amount of 1.0 g/m².
  —Coating Solution Composition (IX)—
  m, p-Cresol novolac (m/p ratio=6/4, weight-average molecular weight of 5,000): 0.474 parts
  Specific polymer compound (component A) listed in Table 6: 2.37 parts
  Infrared absorbent (above IR coloring agent (1)): 0.155 parts 2-Methoxy-4-(N-phenylamino)benzenediazonium hexafluorophosphate: 0.03 parts
Tetrahydrophthalic anhydride: 0.19 parts
Product obtained by replacing a counter ion of ethyl violet with 6-hydroxy-β-naphthalenesulfonic acid: 0.11 parts
Fluorine-based surfactant (MEGAFAC F-780, manufactured by DIC Corporation): 0.07 parts
p-Toluenesulfonic acid: 0.008 parts
Bis-p-hydroxyphenyl sulfone: 0.13 parts
3,3'-Dimyristyl thiodipropionate: 0.04 parts
Lauryl stearate: 0.02 parts
γ-Butyrolactone: 13 parts
Methyl ethyl ketone: 24 parts
1-Methoxy-2-propanol: 11 parts Evaluations were performed on the obtained planographic printing plate precursors under the same conditions as in Example 1 except that a developer LH-DS (manufactured by Fujifilm Corporation) was used during a development treatment, and the results are listed in Table 6.

TABLE 6

|  | Support | Component A | Development time for non-image area | Non-burning printing durability Number of printed sheets (ten thousand sheets) | Burning printing durability | Chemical resistance |
|---|---|---|---|---|---|---|
| Example 81 | A-1 | PA-1 | 1 | 15 | 1 | 1 |
| Example 82 | B-1 | PA-1 | 1 | 15 | 1 | 1 |
| Example 83 | C-1 | PA-1 | 1 | 15 | 1 | 1 |
| Example 84 | D-1 | PA-1 | 1 | 15 | 1 | 1 |
| Example 85 | E-1 | PA-1 | 1 | 15 | 1 | 1 |
| Example 86 | F-1 | PA-1 | 1 | 15 | 1 | 1 |
| Example 87 | A-1 | PA-2 | 1 | 14 | 1 | 1 |
| Example 88 | A-1 | PA-3 | 2 | 14 | 1 | 1 |
| Example 89 | A-1 | PA-4 | 2 | 15 | 1 | 1 |
| Example 90 | A-1 | PA-5 | 2 | 13 | 1 | 1 |
| Example 91 | A-1 | PA-7 | 1 | 15 | 1 | 1 |
| Example 92 | A-1 | PA-9 | 1 | 14 | 1 | 1 |
| Example 93 | A-1 | PA-11 | 1 | 15 | 1 | 1 |
| Example 94 | A-1 | PA-13 | 1 | 15 | 1 | 1 |
| Example 95 | A-1 | PA-16 | 1 | 15 | 1 | 2 |
| Example 96 | A-1 | PA-17 | 1 | 13 | 1 | 2 |
| Example 97 | A-1 | PA-19 | 2 | 15 | 1 | 2 |
| Example 98 | A-1 | PA-31 | 1 | 15 | 3 | 1 |
| Example 99 | A-1 | PA-32 | 1 | 15 | 3 | 1 |
| Example 100 | A-1 | PA-34 | 1 | 15 | 3 | 1 |
| Comparative Example 13 | A-1 | CP-1 | 4 | 9 | 3 | 2 |
| Comparative Example 14 | A-1 | CP-2 | 4 | 7 | 4 | 4 |
| Comparative Example 15 | A-1 | CP-3 | 1 | 5 | 3 | 1 |

As evident from the results listed in Table 6, it was understood that all of the chemical resistance, the developability, and the printing durability were excellent in a case where the photosensitive resin composition of the present disclosure was used.

The disclosure of JP No. 2015-171038 filed on Aug. 31, 2015 is incorporated herein by reference.

The disclosure of JP No. 2016-129350 filed on Jun. 29, 2016 is incorporated herein by reference.

All documents, patent applications, and technical standards described in the present specification are incorporated herein by reference to the same extent as a case of being specifically and individually noted that individual documents, patent applications, and technical standards are incorporated by reference.

What is claimed is:

1. A planographic printing plate precursor comprising:
   a support; and
   a recording layer, which contains a polymer compound having a structure represented by Formula 2, as a component A, and an infrared absorbent, as a component B, on the support:

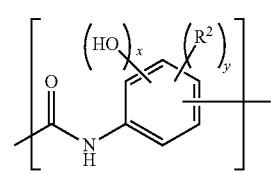

Formula 2 wherein, in Formula 2, each $R^2$ independently represents an alkyl group or an aryl group, x represents an integer of 1 to 4, and y represents an integer of 0 to 3.

2. The planographic printing plate precursor according to claim 1,
   wherein the component A is a polymer compound having a structure represented by Formula 3,

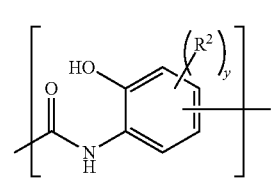

Formula 3 wherein, in Formula 3, each $R^2$ independently represents an alkyl group or an aryl group, and y represents an integer of 0 to 3.

3. The planographic printing plate precursor according to claim 1, which is a positive planographic printing plate precursor.

4. The planographic printing plate precursor according to claim 1,
wherein the recording layer has a two-layer structure formed of a lower layer and an upper layer, and
at least one layer of the lower layer or the upper layer contains the component A and the component B.

5. The planographic printing plate precursor according to claim 1, further comprising:
an interlayer between the support and the recording layer.

6. A plate-making method for a planographic printing plate, comprising:
an exposure step of image-exposing the planographic printing plate precursor according to claim 1; and
a development step of developing the exposed planographic printing plate precursor using an alkali aqueous solution having a pH of 8.5 to 13.5.

* * * * *